US012799843B2

(12) United States Patent
Jandhyala et al.

(10) Patent No.: US 12,799,843 B2
(45) Date of Patent: Nov. 17, 2026

(54) METHOD TO TAILOR PERFORMANCE PROPERTIES OF CEMENT BARRIERS

(71) Applicant: Halliburton Energy Services, Inc., Houston, TX (US)

(72) Inventors: Siva Rama Krishna Jandhyala, Houston, TX (US); Mingwei Cai, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 642 days.

(21) Appl. No.: 18/497,421

(22) Filed: Oct. 30, 2023

(65) Prior Publication Data

US 2025/0137346 A1 May 1, 2025

(51) Int. Cl.
*E21B 33/13* (2006.01)
*C09K 8/46* (2006.01)
*G06F 30/27* (2020.01)

(52) U.S. Cl.
CPC ................ *E21B 33/13* (2013.01); *C09K 8/46* (2013.01); *G06F 30/27* (2020.01); *E21B 2200/20* (2020.05)

(58) Field of Classification Search
None
See application file for complete search history.

(56) References Cited

U.S. PATENT DOCUMENTS 11,732,579 B2 8/2023 Jandhyala et al.
12,241,333 B2 * 3/2025 Singh ....................... C09K 8/42
(Continued)

FOREIGN PATENT DOCUMENTS

AU 2022420837 A1 * 3/2024 ............. G16C 20/30
CN 104820870 A 8/2015
(Continued)

OTHER PUBLICATIONS

International Search Report and Written Opinion for International Patent Application No. PCT/US2024/039394 dated Nov. 13, 2024. PDF file. 7 pages.

*Primary Examiner* — Shelley Chen
(74) *Attorney, Agent, or Firm* — Thomas Rooney; C. Tumey Law Group PLLC

(57) ABSTRACT

A method of designing a cement slurry may include: (a) providing cement design requirements for the cement slurry wherein the cement design requirements comprise at least one cement performance property selected from the group consisting of compressive strength, tensile strength, cohesion, friction angle, Young's modulus, Poisson's ratio, and any combination thereof; (b) providing a virtual cement slurry recipe representing at least water and a concentration thereof and one or more cementitious materials and a concentration thereof; (c) inputting at least a well condition and the virtual cement slurry into a cement performance property model; (d) predicting performance properties for the virtual cement slurry recipe using at least the cement performance property model, wherein the performance properties comprise at least one of compressive strength, tensile strength, cohesion, friction angle, Young's modulus, and Poisson's ratio; (e) comparing the predicted performance properties to the cement design requirements; and (f) preparing a cement slurry according to the virtual cement slurry recipe if the predicted performance properties for the virtual cement slurry recipe satisfy the cement design requirements or repeating (b)-(f) if the virtual cement slurry recipe does not satisfy the cement design requirements, where the step of providing the virtual cement slurry recipe comprises providing a virtual cement slurry recipe with a disparate concentration of water, a disparate concentration
(Continued)

of one or more of the cementitious materials, and/or a disparate chemical identity of the one or more cementitious materials.

20 Claims, 12 Drawing Sheets

(56) References Cited

U.S. PATENT DOCUMENTS

| | | | |
|---|---|---|---|
| 12,595,715 | B2 * | 4/2026 | Amini ................ C04B 40/0032 |
| 2015/0321953 | A1 * | 11/2015 | Porcherie ............... C04B 28/04 106/713 |
| 2016/0258246 | A1 | 9/2016 | Jandhyala et al. |
| 2017/0096874 | A1 | 4/2017 | Parsons et al. |
| 2020/0369942 | A1 | 11/2020 | Singh et al. |
| 2021/0150104 | A1 | 5/2021 | Singh et al. |
| 2021/0171408 | A1 | 6/2021 | Singh et al. |
| 2021/0172280 | A1 * | 6/2021 | Singh ..................... E21B 33/13 |
| 2022/0009835 | A1 | 1/2022 | Jandhyala et al. |
| 2022/0009844 | A1 | 1/2022 | Jandhyala et al. |
| 2022/0009845 | A1 | 1/2022 | Jandhyala et al. |
| 2022/0009846 | A1 | 1/2022 | Jandhyala et al. |
| 2022/0009847 | A1 | 1/2022 | Singh et al. |
| 2022/0010190 | A1 | 1/2022 | Singh et al. |
| 2022/0398807 | A1 | 12/2022 | Sun et al. |
| 2023/0111521 | A1 | 4/2023 | Singh et al. |
| 2023/0187029 | A1 | 6/2023 | Jandhyala et al. |
| 2023/0193720 | A1 * | 6/2023 | Amini ................ C04B 40/0032 166/285 |
| 2023/0258068 | A1 | 8/2023 | Jandhyala et al. |
| 2023/0281355 | A1 | 9/2023 | Jandhyala et al. |

FOREIGN PATENT DOCUMENTS

| | | | | | |
|---|---|---|---|---|---|
| CN | 116861819 | A | * | 10/2023 | ............ G06F 30/28 |
| CN | 116992789 | A | * | 11/2023 | ............ G06F 30/28 |
| CN | 116151022 | B | * | 4/2024 | ............ G06F 30/20 |
| CN | 114334025 | B | * | 3/2025 | |
| EP | 2740780 | A1 | * | 6/2014 | ............ C04B 28/04 |
| EP | 3202743 | A1 | | 8/2017 | |
| EP | 4102395 | A1 | | 12/2022 | |
| GB | 2639108 | A | * | 9/2025 | .......... G06N 3/0985 |
| KR | 102438041 | B1 | * | 8/2022 | ............ G16C 20/30 |
| WO | WO-2013185019 | A1 | * | 12/2013 | .......... G01N 33/383 |
| WO | WO-2014007878 | A1 | * | 1/2014 | .............. G01N 3/10 |
| WO | WO-2014088916 | A1 | * | 6/2014 | ............ C04B 28/04 |
| WO | WO-2019156691 | A1 | * | 8/2019 | .......... C09K 8/5045 |
| WO | WO-2020204952 | A1 | * | 10/2020 | .............. C09K 8/42 |
| WO | WO-2020204957 | A1 | * | 10/2020 | .............. C09K 8/42 |
| WO | WO-2023039653 | A1 | * | 3/2023 | .............. G06N 3/08 |
| WO | WO-2024181984 | A1 | * | 9/2024 | ........ C04B 40/0231 |
| WO | WO-2025193240 | A1 | * | 9/2025 | .......... G01N 21/255 |

* cited by examiner

METHOD TO TAILOR PERFORMANCE PROPERTIES OF CEMENT BARRIERS

BACKGROUND

In well cementing, such as well construction and remedial cementing, cement slurries are commonly utilized. Cement slurries may be used in a variety of subterranean applications. For example, in subterranean well construction, a pipe string (e.g., casing, liners, expandable tubulars, etc.) may be run into a well bore and cemented in place. The process of cementing the pipe string in place is commonly referred to as "primary cementing." In a typical primary cementing method, a cement slurry may be pumped into an annulus between the walls of the well bore and the exterior surface of the pipe string disposed therein. The cement slurry may set in the annular space, thereby forming an annular sheath of hardened, substantially impermeable cement (i.e., a cement sheath) that may support and position the pipe string in the well bore and may bond the exterior surface of the pipe string to the subterranean formation. Among other things, the cement sheath surrounding the pipe string functions to prevent the migration of fluids in the annulus, as well as protecting the pipe string from corrosion. Cement slurries also may be used in remedial cementing methods, for example, to seal cracks or holes in pipe strings or cement sheaths, to seal highly permeable formation zones or fractures, to place a cement plug, and the like.

A particular challenge in cementing is to design cement slurries in a manner that helps ensure well integrity and longevity. Oftentimes, it is desirable to provide cement slurries that will reliably perform at downhole conditions such that the stresses in the wellbore do not exceed the material limits of the cement after it has been set. Common techniques for predicting the material limits of cement often involve sample curing under downhole or equivalent temperature and pressure conditions, preparation, and elaborate testing. This process may have to be repeated by changing cement composition before arriving at an acceptable cement design with the desired properties.

BRIEF DESCRIPTION OF THE DRAWINGS

These drawings illustrate certain aspects of some of the embodiments of the present disclosure and should not be used to limit or define the disclosure.

DETAILED DESCRIPTION

Figure 1:
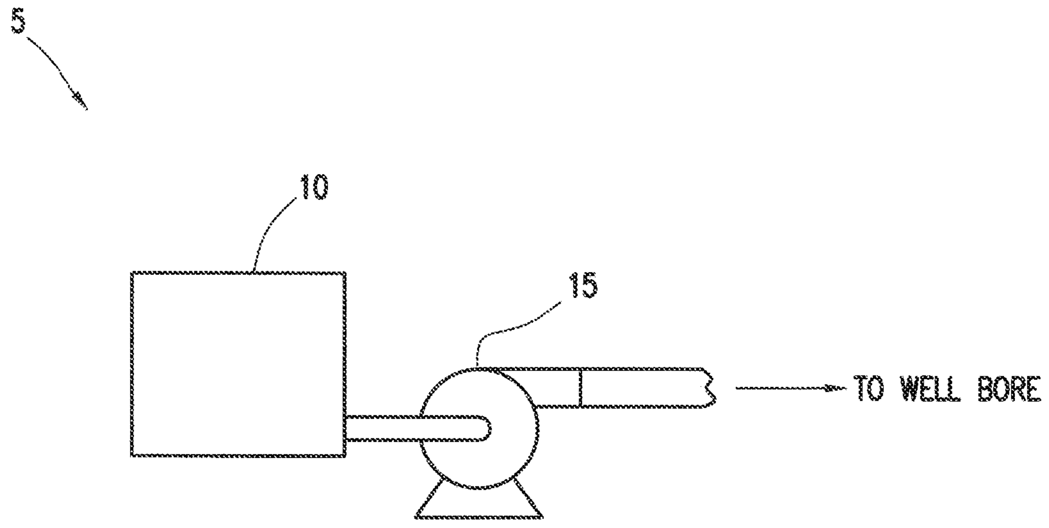
FIG. 1 is a schematic illustration of an example system for the preparation and delivery of a cement slurry to a wellbore, in accordance with one or more embodiments of the present disclosure.

The present disclosure may generally relate to cementing methods and systems, and, more particularly, embodiments may be directed to designing cement slurry recipes using a cement performance property model as well as preparing a cement slurry based on the cement slurry recipe. Particularly, a model-based approach for designing for a target performance property of a cement is disclosed. The present methods and systems may utilize a model-based approach that relates performance properties with barrier composition, curing, and testing conditions.

Cement slurries may include cement, supplementary cementitious additives, inert materials, and chemical additives. Cement slurry recipes, sometimes referred to as a cement design or other equivalent names thereof, may be unique to each well to satisfy the differing design requirements for each well. Cement slurry recipes may be developed such that a cement slurry prepared from the cement slurry recipe meets the placement-related design requirements for a cement slurry such as viscosity, density, and rheology, for example, and that a set cement resulting from the setting of the cement slurry meets all the long term integrity related design requirements such as compressive strength, tensile strength, Young's modulus, for example. When the cement slurry recipe is developed, representative samples of cement slurry may be prepared and tested in a laboratory to verify that the cement slurry and set cement have the required physical properties. Performance properties of a cement prepared from the cement slurry recipe may be measured in a laboratory using standard tests to ensure that the performance properties remain above target performance properties. Once a cement slurry recipe is verified as meeting the design requirements, the cement slurry recipe may be selected for preparation and the prepared slurry may be introduced into a wellbore. A cement slurry for use in cementing wellbores is typically mixed at a wellbore pad site using cement mixing equipment and pumped into the wellbore using cement pumps.

Cement performance property models are presented herein. One or more of the underlying cement performance property models may map cement slurry composition and testing conditions to predict API performance properties. The underlying cement performance property models may be utilized to design a cement slurry recipe to have a target performance property. One or more of the underlying cement performance property models may account for the effect on performance properties due to bulk blend components such as Portland cement, supplementary cementitious materials, crystalline silica, weighting materials such as beads, and the amount of water. One or more of the underlying cement performance property models may capture interactions between the bulk components as well as the temperature effects on the contribution of each slurry component to predicted performance properties.

Performance properties of a cement slurry are controlled by several factors including amount of water in the slurry (w), identity of and amount of Portland cement ($P_i$), identity of and amount of Pozzolanic materials (Poz) (e.g., fly ash, pumice, silica, cement kiln dust, etc.), identity of and amount of supplementary cementitious materials ($S_j$), identity of and amount of inert materials ($I_k$) (e.g., light weight beads, heavy weight metal oxides, lost circulation materials, elastomers, fibers, etc.), identity of and amount of the chemical additives (e.g., accelerators, retarders, polymers, latex, polyvinyl alcohol, resin, crystalline silica, etc.) which may influence the performance properties ($C_l$), curing temperature (T), curing time (t), and confining pressure (P). Further, there may be other factors such as sand, salts, and any other kind of additives. A general formula for performance properties may include equation 1 where f may be a linear or non-linear function and the indices i, j, k, and l represent the possibility of multiple Portland cements, multiple Pozzolanic materials, supplementary cementitious materials, inert materials, and chemical additives. In some embodiments, the function f may be described by a neural net, a decision tree, or an explicit mathematical form.

$$C_l = f(w, P_i, Poz_i, S_j, I_k, T, t, P) \quad \text{Equation 1}$$

Example performance properties include ultimate compressive strength, tensile strength, cohesion, friction angle or other elastic properties (EP). Elastic properties may include Young's modulus and Poisson's ratio.

Without limiting to a specific testing technique, compressive strength is generally the capacity of a solid particulate material or structure to withstand axially directed pushing forces. The compressive strength of the cement component may be measured at a specified time after a cement component has been mixed with water and the resultant cement slurry is maintained under specified temperature and pressure conditions. For example, compressive strength can be measured at a time in the range of about 24 to about 48 hours (or longer) after a cement slurry is mixed and the slurry is maintained at a temperature of from 40 °F to about 500 °F and at atmospheric or elevated pressure. Compressive strength can be measured by either a destructive method or non-destructive method. The destructive method physically tests the strength of cement samples by crushing the samples in a compression-testing machine. The compressive strength may be calculated from the failure load divided by the cross-sectional area resisting the load and is reported in units of pound-force per square inch (psi). Non-destructive methods typically may employ an Ultrasonic Cement Analyzer ("UCA"), available from Fann® Instrument Company, Houston, TX. Compressive strengths may be determined in accordance with API RP 10B-2, *Recommended Practice for Testing Well Cements*, First Edition, July 2005.

Without being limited to any specific testing technique, tensile strength is generally the capacity of a solid particulate material to withstand loads tending to elongate, as opposed to compressive strength. For example, the tensile strength of a cement component may be measured at a specified time after a cement component has been mixed with water and the resultant cement slurry is maintained under specified temperature and pressure conditions. For example, tensile strength can be measured at a time in the range of about 24 to about 48 hours (or longer) after a sample is mixed and the sample is maintained at a temperature of from 40 °F to about 500 °F and atmospheric or elevated pressure. Tensile strength may be measured using any suitable method, including without limitation in accordance with the procedure described in ASTM C307. That is, specimens may be prepared in briquette molds having the appearance of dog biscuits with a one square inch cross-sectional area at the middle. Tension may then be applied at the enlarged ends of the specimens until the specimens break at the center area. The tension in pounds per square inch at which the specimen breaks is the tensile strength of the solid particulate material tested.

Young's modulus also referred to as the modulus of elasticity is a measure of the relationship of an applied stress to the resultant strain. In general, a highly deformable (resilient) solid particulate material will exhibit a lower modulus. Thus, the Young's modulus is an elastic constant that demonstrates the ability of the tested solid particulate material to deform under applied loads. Several different laboratory techniques may be used to measure Young's modulus of a sample comprising a pozzolanic component after a test sample has been allowed to set for a period of time at specified temperature and pressure conditions.

Without being limited to any specific testing technique, friction angle is the angle at which a granular material can naturally rest or slope without collapsing or undergoing shear failure, and which measures the internal resistance to shear within a material. Specifically, friction angle is the angle of an inclined surface where a material starts to slide or deform.

Without being limited to any specific testing technique, cohesion is generally the ability of the components of a cement to bond to each other. Cohesion may be a function of ultimate compressive strength and friction angle, as shown in Equation 2. Equation 2 is valid for isotropic brittle materials, like cement. In Equation 2, UCS is ultimate compressive strength, Cohesion is the cohesion, and φ is friction angle.

$$\text{Cohesion} = \frac{UCS}{2}\left(\frac{1-\sin\varphi}{\cos\varphi}\right) \quad \text{Equation 2}$$

One model-based technique for predicting performance properties involves Equation 3. In Equation 3, $C_l$ is a performance property of a cement (e.g., an elastic property), w is mass of water, Mass Poz is a mass of pozzolans, Vol Poz is a volume of pozzolans, $\text{Vol}_i$ is volume of pozzolanic species i, Mass $\text{Add}_j$ is the mass of an additive j, mass $\text{blend}_k$ is the mass of a blend species k, Well $\text{Cond}_l$ is a well condition l, e.g., temperature, pressure, etc., and $a_0$, $a_i$, $a_j$, $a_k$, and $a_l$ are constants.

Equation 3

$$C_l = a_0\left(\frac{w}{\text{Mass } Poz}\right) + \sum_i\left(\frac{Vol_i}{Vol\,Poz}\right)a_i + \sum_j\left(\frac{\text{Mass Add}_j}{\text{Mass } Poz}\right)a_j + \sum_k\left(\frac{\text{Mass blend}_k}{\text{Mass } Poz}\right)a_k + \sum_l(\text{Well } Cond_l)a_l$$

Equation 3 has a linear form. The model-based technique may alternatively, or additionally involve Equation 4, which has a non-linear form. In Equation 4, $C_l$ is a performance property of a cement (e.g., an elastic property), w is mass of water, Mass Poz is a mass of pozzolans, Vol Poz is a volume of pozzolans, $\text{Vol}_i$ is volume of pozzolanic species i, Mass $\text{Add}_j$ is the mass of an additive j, mass $\text{blend}_k$ is the mass of a blend species k, Well $\text{Cond}_l$ is a well condition l, e.g., temperature, pressure, etc., and $a_0$, $a_i$, $a_j$, $a_k$, and $a_l$ are constants.

Equation 4

$$C_l = a_0\left(\frac{w}{Poz}\right)^a + e^{\sum_i\left(\frac{Vol_i}{Vol\,Poz}\right)a_i} + e^{\sum_j\left(\frac{Mass\,Add_j}{Mass\,Poz}\right)a_j} + e^{\sum_k\left(\frac{Mass\,blend_k}{Mass\,Poz}\right)a_k} + e^{\sum_l(Well\,Cond_l)a_l}$$

The model-based techniques described herein may alternatively, or additionally, involve other equation forms, for example, polynomial equations, physics-based equations, linear regressions, etc., which may relate one or more elastic properties to cement composition and well conditions. These equation-type models may allow personnel to interpret behavior of various factors without requiring new predictions of a property each time a new cement composition is analyzed. For example, the sign and magnitude of the constant $a_0$ will predict if the elastic property will increase or decrease upon addition of more water, and also quantify by how much the elastic property will increase or decrease.

The model-based techniques described herein may alternatively, or additionally, involve one or more black box models including, for example, various Neural Networks, tree-based models (e.g., XG Boost), random forest models, and others. The cement performance property models may capture the complex relationship between the various model parameters and may be particularly useful when the deterministic-type models yield poor performance. Outputs of example random forest models are shown in later figures which relate ultimate compressive strength, cohesion, tensile strength, Young's modulus and Poisson's ratio to cement composition and wellbore conditions (e.g., curing temperature, curing pressure, curing time, confining pressure).

Other forms of black box models may include, to use non-limiting examples: various machine learning and/or artificially intelligent algorithms; a supervised, semi-supervised, unsupervised, and/or reinforced model; a binary classification model; a multiclass classification model; a regression model; decision trees; a random forest classifier; logistic regression; support vector machine algorithms (SVM); a Naive Bayes classifier; k-nearest neighbors (K-NN) algorithms; clustering; k-means clustering; a dimensionality reduction algorithm; a gradient boosting algorithm; a probabilistic classifier; one or more physics-informed neural networks (PINNs); and any combination thereof.

Where the cement performance property models of the present disclosure involve machine learning, a method may rely on pre-trained models, which may have been trained using training data. For example, training data may comprise measured or calculated performance properties for real cement compositions, and which may comprise data, or data originating from, any of the laboratory techniques herein disclosed. Pre-trained models may be formed, for example, from machine learning algorithms, of which there exists a wide range of suitable classes and types. In general, machine learning algorithms, which may be capable of capturing the underlying relationships within a dataset, may be broken into different categories. One such category may comprise whether the machine learning algorithm functions using supervised, unsupervised, semi-supervised, or reinforcement learning. The objective of a supervised learning algorithm may be to determine one or more dependent variables based on their relationship to one or more independent variables. Supervised learning algorithms are named as such because the dataset comprises both independent and corresponding dependent values where the dependent value may be thought of as "the answer," that the model is seeking to predict from the underlying relationships in the dataset. As such, the objective of a model developed from a supervised learning algorithm may be to predict the outcome of one or more scenarios which do not yet have a known outcome. Supervised learning algorithms may be further divided according to their function as classification and regression algorithms. When the dependent variable is a label or a categorical value, the algorithm may be referred to as a classification algorithm. When the dependent variable is a continuous numerical value, the algorithm may be a regression algorithm. In a non-limiting example, algorithms utilized for supervised learning may comprise Neural Networks, K-Nearest Neighbors, Naïve Bayes, Decision Trees, Classification Trees, Regression Trees, Random Forests, Linear Regression, Support Vector Machines (SVM), Gradient Boosting Regression, genetic algorithm, and Perception Back-Propagation.

The objective of unsupervised machine learning may be to identify similarities and/or differences between data points within a dataset which may allow the dataset to be divided into groups or clusters without the benefit of knowing which group or cluster the data may belong to. Datasets utilized in unsupervised learning may not comprise a dependent variable as the intended function of this type of algorithm is to identify one or more groupings or clusters within a dataset. In a non-limiting example, algorithms which may be utilized for unsupervised machine learning may comprise K-means clustering, K-means classification, Fuzzy C-Means, Gaussian Mixture, Hidden Markov Model, Neural Networks, and Hierarchical algorithms.

Independent variables input into a machine learning model or other type of machine learning-driven cement performance property model may comprise, for example, curing temperature, curing pressure, curing time, confining pressure, and material composition. Curing temperature is the temperature at which a cement slurry cures. Curing temperature may refer to a single temperature, to a range of temperatures, and in some examples, may be a function of time. Curing temperature may, in some examples, account for the heat of reaction during a curing process. Thus, curing temperature as used as an independent variable input into a machine learning model may comprise an array of values over a time period, in some examples, or a single starting-point temperature in others. Another independent variable may comprise curing pressure. Curing pressure may comprise a single pressure value, or a plurality. The curing pressure may also be time-dependent, and may be affected by various factors, e.g., concentration of species, the reaction of cement, etc., before being used as an independent variable in a machine learning process or prediction. In some examples, the curing pressure may simply be the pressure of a cement slurry when it is first introduced to the location where it will permanently form. Curing time may refer to the amount of time a cement composition is expected to remain undisturbed by well operations. In some examples, curing time is measured based on how long it takes for the slurry to develop over 90% of hydration. Confining pressure, which differs from curing pressure, refers to the subsurface, geological pressure applied on a cement by the formation after the cement has been allowed to set.

Dependent variables determined by a machine learning model may comprise any of the performance characteristics herein described, including but not limited to, ultimate compressive strength, tensile strength, Young's modulus, Poisson's ratio, cohesion, and friction angle.

Cement slurries may be prepared by mixing a dry cement blend with water. The dry cement blend may be prepared at a bulk cementing. A cement slurry recipe may include a listing of solid and liquid cement components and quantities thereof to include in a bulk dry blend. Cement slurry recipes may be engineered to have a particular performance properties value such that a cement slurry prepared based on the cement slurry recipe has a predictable value. Typically, the components of the bulk dry blend cement are measured and then dry blended together using appropriate blending machinery. The cement slurry recipe may include listing of bulk materials and amounts thereof to include such as cements which develop compressive strength when mixed with water as well as supplementary cementitious materials which do not develop compressive strength when mixed with water but contribute to compressive strength development when mixed with cement and water. The cement slurry recipe may further include a listing of inert materials, chemical additives and amounts thereof such as those chemical additives which modify the physical properties of a cement slurry prepared using the cement slurry recipe or a set cement thereof. Additives may include, but are not limited to, salts, retarders, accelerators, gel strength controllers, and suspending aids, for example. The cement slurry recipe may further include a listing of amount of water to include when preparing a cement slurry based on the cement slurry density. The bulk dry blend cement may be transported to a location, such as a well pad site, where the bulk dry blend cement may be mixed with water, in the quantity listed by the cement slurry recipe or to form a cement slurry with the desired density, which may then be introduced into a wellbore. In some embodiments, the cement slurry recipe may further include liquid additives which may be mixed with the cement slurry.

Performance properties of a cement slurry primarily stem from the choice of the bulk components. As such, the selection of bulk materials may influence the performance properties observed at a given wellbore condition, e.g., pressure and temperature. The temperature and pressure dependance of a performance property may be written in various different ways, such as, without limitation, as an Arrhenius expression or a polynomial. The temperature and pressure dependance may also be a power law, logarithmic, trigonometric or any transcendental function or an analytic expression, or may even be described by a neural net or a decision tree or a combination thereof. Performance properties may also be dependent on, for example, particle shape, size, size-distribution, morphology, surface charges, dissolvable species, etc. In some examples, there may be interactions between components of the cement slurry. The interactions may enhance effect on performance properties control resulting in lower net performance properties when the negatively interacting components are included together in a cement slurry. Alternatively, the performance properties may be enhanced resulting in greater net performance properties when positively interacting components are included in the cement slurry. There may be various reasons for component interactions.

A model of performance properties for a particular additive for a given cement formulation under specific test conditions may be written as a function of the blend, amount of water, amount of pozzolans, volume of pozzolans, volume of a species, amount of an additive, and well conditions. Such a function may be a linear or a non-linear function of the type and amount of the performance properties control additive. The function may be a polynomial, power law, exponential, logarithmic, trigonometric or any transcendental function or an analytic expression, or may even be described by a neural net or a decision tree.

FIG. 1 illustrates an example system 5 for preparation of a cement slurry including and delivery of the cement slurry to a wellbore. The cement slurry may be any cement slurry disclosed herein. A cement slurry recipe be developed, for example, using the cement performance property models described herein, and a cement slurry may be prepared based on the cement slurry recipe. As shown, the cement slurry may be mixed in mixing equipment 10, such as a jet mixer, re-circulating mixer, or a batch mixer, for example, and then pumped via pumping equipment 15 to the wellbore. In some examples, the mixing equipment 10 and the pumping equipment 15 may be disposed on one or more cement trucks as will be apparent to those of ordinary skill in the art. In some examples, a jet mixer may be used, for example, to continuously mix a dry blend including the cement slurry, for example, with the water as it is being pumped to the wellbore.

Figure 2:
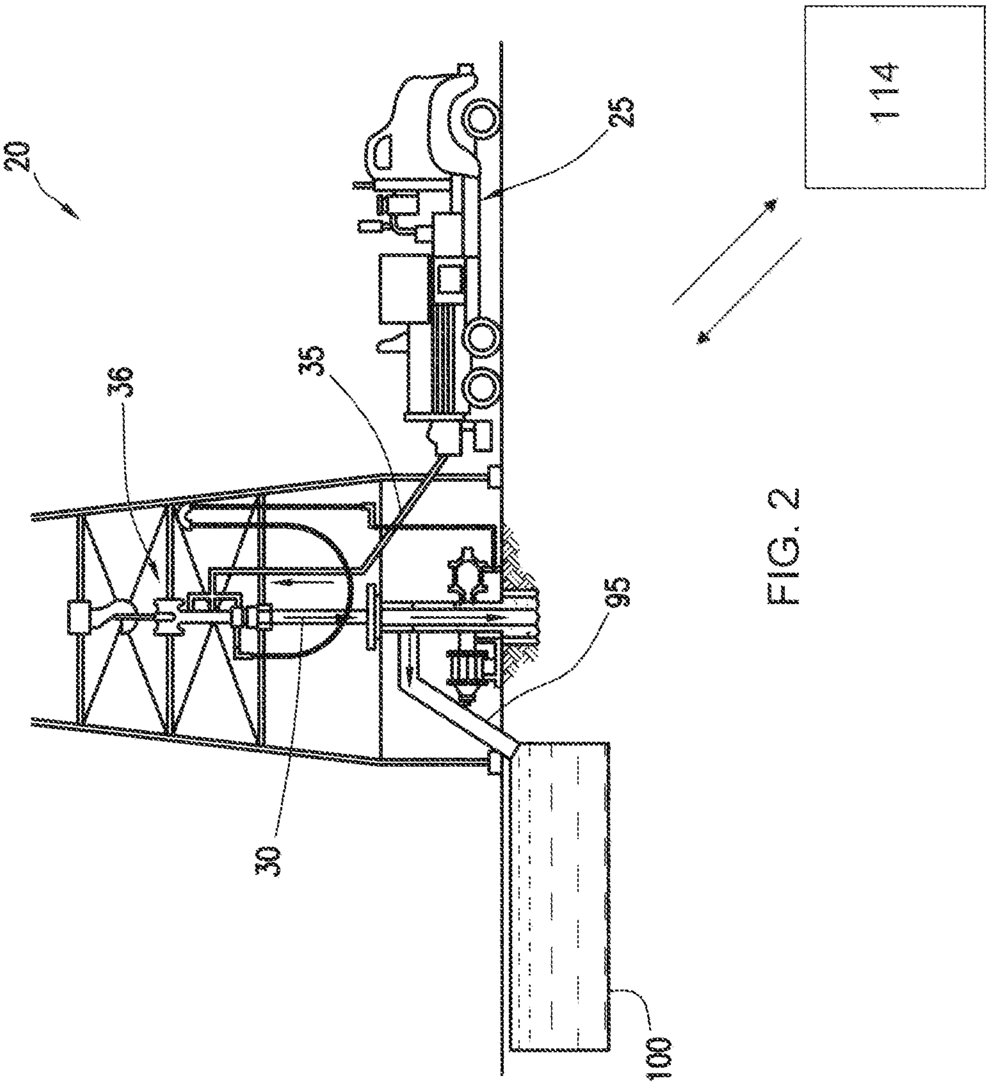
FIG. 2 is a schematic illustration of example surface equipment that may be used in the placement of a cement slurry in a wellbore, in accordance with one or more embodiments of the present disclosure.

An example technique for placing a cement slurry into a subterranean formation will now be described with reference to FIGS. 2 and 3. FIG. 2 illustrates example surface equipment 20 that may be used in placement of a cement slurry. The cement slurry may be any cement slurry disclosed herein. A cement slurry recipe be developed, for example, using the cement performance property models described herein, and a cement slurry may be prepared based on the cement slurry recipe. It should be noted that while FIG. 2 generally depicts a land-based operation, those skilled in the art will readily recognize that the principles described herein are equally applicable to subsea operations that employ floating or sea-based platforms and rigs, without departing from the scope of the disclosure. As illustrated by FIG. 2, the surface equipment 20 may include a cementing unit 25, which may include one or more cement trucks. The cementing unit 25 may include mixing equipment 10 and pumping equipment 15 (e.g., FIG. 1) as will be apparent to those of ordinary skill in the art. The cementing unit 25 may pump a cement slurry 30 through a feed pipe 35 and to a cementing head 36 which conveys the cement slurry 30 downhole. Also, as illustrated, one or more operations shown by FIG. 2 may be performed using (e.g., assisted by) an information handling system 114, to be discussed in greater detail.

Figure 3:
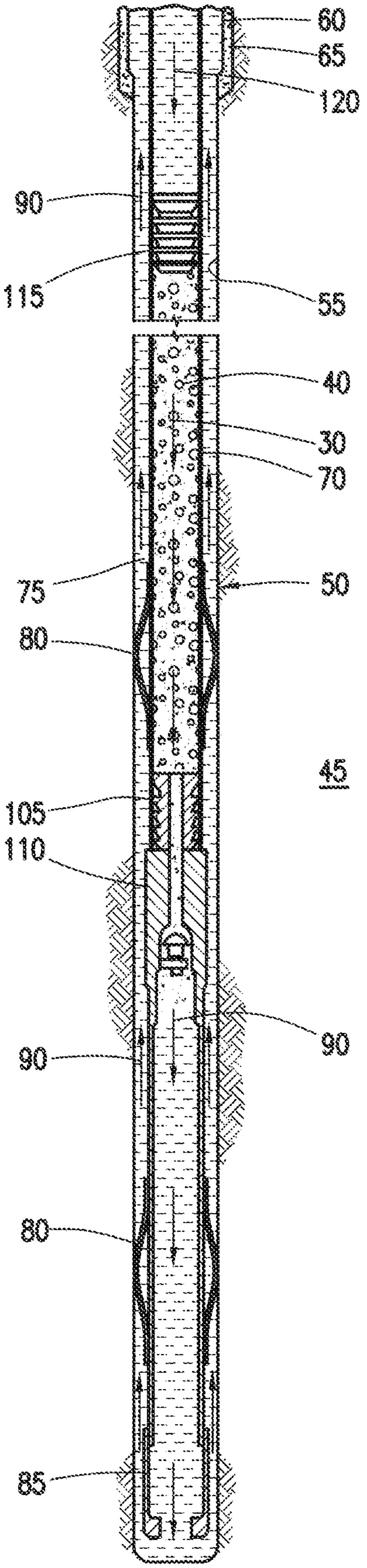
FIG. 3 is a schematic illustration of the example placement of a cement slurry into a wellbore annulus, in accordance with one or more embodiments of the present disclosure.

Turning now to FIG. 3, the cement slurry 30, may be placed into a subterranean formation 45. As illustrated, a wellbore 50 may be drilled into one or more subterranean formations 45. While the wellbore 50 is shown extending generally vertically into the one or more subterranean formation 45, the principles described herein are also applicable to wellbores that extend at an angle through the one or more subterranean formations 45, such as horizontal and slanted wellbores. As illustrated, the wellbore 50 includes walls 55. In the illustrated example, a surface casing 60 has been inserted into the wellbore 50. The surface casing 60 may be cemented to the walls 55 of the wellbore 50 by cement sheath 65. In the illustrated example, one or more additional conduits (e.g., intermediate casing, production casing, liners, etc.), shown here as casing 70 may also be disposed in the wellbore 50. As illustrated, there is a wellbore annulus 75 formed between the casing 70 and the walls 55 of the wellbore 50 and/or the surface casing 60. One or more centralizers 80 may be attached to the casing 70, for example, to centralize the casing 70 in the wellbore 50 prior to and during the cementing operation.

With continued reference to FIG. 3, the cement slurry 30 may be pumped down the interior of the casing 70. The cement slurry 30 may be allowed to flow down the interior of the casing 70 through the casing shoe 85 at the bottom of the casing 70 and up around the casing 70 into the wellbore annulus 75. The cement slurry 30 may be allowed to set in the wellbore annulus 75, for example, to form a cement sheath that supports and positions the casing 70 in the wellbore 50. While not illustrated, other techniques may also be utilized for introduction of the cement slurry 30. By way of example, reverse circulation techniques may be used that include introducing the cement slurry 30 into the subterranean formation 45 by way of the wellbore annulus 75 instead of through the casing 70.

As it is introduced, the cement slurry 30 may displace other fluids 90, such as drilling fluids and/or spacer fluids that may be present in the interior of the casing 70 and/or the wellbore annulus 75. At least a portion of the displaced fluids 90 may exit the wellbore annulus 75 via a flow line 95 and be deposited, for example, in one or more retention pits 100 (e.g., a mud pit), as shown on FIG. 2. Referring again to FIG. 3, a bottom plug 105 may be introduced into the wellbore 50 ahead of the cement slurry 30, for example, to separate the cement slurry 30 from the other fluids 90 that may be inside the casing 70 prior to cementing. After the bottom plug 105 reaches the landing collar 110, a diaphragm or other suitable device should rupture to allow the cement slurry 30 through the bottom plug 105. In FIG. 3, the bottom plug 105 is shown on the landing collar 110. In the illustrated example, a top plug 115 may be introduced into the wellbore 50 behind the cement slurry 30. The top plug 115 may separate the cement slurry 30 from a displacement fluid 120 and push the cement slurry 30 through the bottom plug 105.

Figure 4:
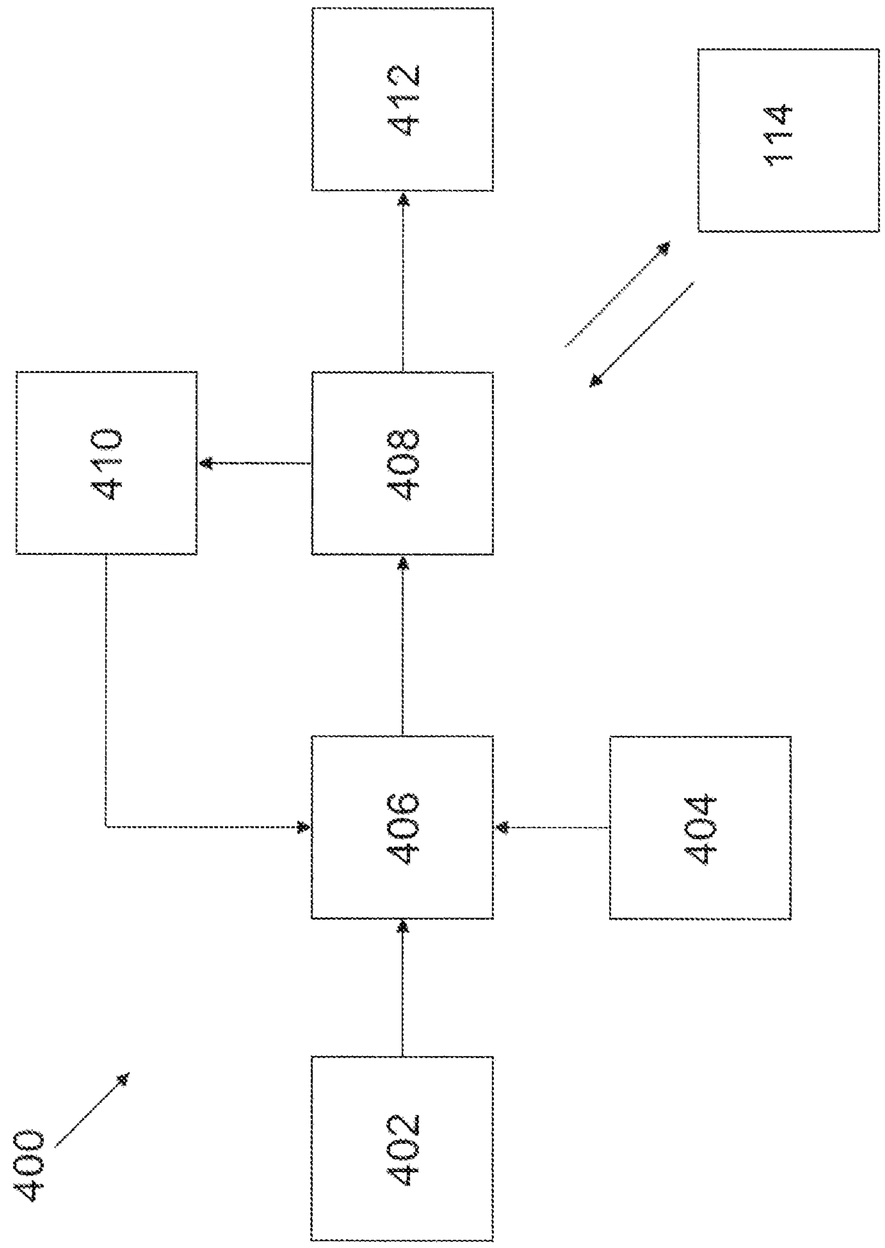
FIG. 4 is a flow chart illustrating a method to design a cement having target performance properties, in accordance with one or more embodiments of the present disclosure.

FIG. 4 is a workflow 400 for preparing a cement slurry recipe. Method 400 may begin at block 402 where the composition of a cement is input into the workflow 400. The input may comprise, or be used to generate, one or more initial guesses for a cement slurry recipe. The inputs and/or initial guesses may depend on, or be selected from, one or more bulk materials, supplementary cementitious materials, or other component to be used in the cement slurry available in a geographic region. For example, some bulk materials may be available in certain regions and not in others. The inputs may also include, in some examples, one or more well conditions, as referenced in the foregoing. Well conditions may comprise, to use non-limiting examples, temperature, pressure, wettability, amount and/or composition of a filter-cake adhered to at least a portion of a wellbore annulus, acidity, combinations thereof, or the like. As illustrated, one or more, e.g., some or all, of the operations of any of the blocks of workflow 400 may be performed by an information handling system 114, to be discussed in greater detail.

Performance properties of a cement are predicted in block 406. Predictions of block 406 may comprise, or be derived from, one or more cement performance property models in block 404. The cement performance property model(s) of block 404 may comprise any of the equation-type models and/or black box models described herein. Thus, predictions of the cement performance property model(s) of block 404 may comprise, for example, Young's modulus of elasticity, Poisson's ratio, tensile strength, ultimate compressive strength, cohesion, friction angle, combinations thereof. In examples where multiple cement performance properties are predicted by a plurality of cement performance property models, each predicted performance property may correspond to a single cement performance property model. Alternatively, in some examples, a single cement performance property model (e.g., a Neural Network) may be used to predict multiple cement performance properties. In addition to performance properties of a cured cement of a cement slurry prepared according to an initial guess for a cement slurry recipe, block 404 may also be used to calculate properties of a cement slurry before or while the slurry is in the process of curing, in some examples. Such properties may comprise fluid properties such as rheology, density, viscosity, etc., as well as thickening time, heat generation, mixability, water requirement, fluid loss, transition time, and other properties of a cement slurry, for example.

After predicting performance properties in block 406, workflow 400 may proceed to block 408. In block 408, an evaluation may be performed to determine if the predictions meet one or more predetermined requirements. Based on this evaluation, the workflow 400 may proceed to block 410 where the cement slurry recipe is modified. The operations of blocks 404, 406, and/or 408 may be performed iteratively until, for example, it is determined in block 408 that a cement prepared from a cement slurry recipe meets one or more cement property requirements. This may involve, in some examples, comparing one or more (e.g., one, two, three, five, etc.) of the predictions generated in block 406 to one or more corresponding predetermined requirements. For example, a method may involve predicting tensile strength, Young's modulus, ultimate compressive strength, cohesion, and friction angle, and comparing these predictions to corresponding predetermined thresholds or requirements. Because the properties being predicted by block 406 are for hypothetical cement slurries which, if prepared and allowed to cure, would result in a hardened cement, the operations of workflow 400 may thus involve virtual cement slurry recipes as well as virtual cement compositions. Where cement compositions are prepared according to the predictions or recommendations of workflow 400, one or more measurable properties of a resulting cement prepared in accordance with a virtual cement slurry may substantially correspond to the last predictions of block 406 for that particular recommended cement slurry recipe, in some examples.

Thus, the present methods and systems may have the advantage of ensuring that a cement slurry recipe yields a cement well barrier having satisfactory performance characteristics for a downhole environment. Once the workflow 400 has yielded a cement slurry recipe whose predicted performance properties are satisfactory relative to the one or more predetermined thresholds, the workflow 400 may proceed to block 412, which may involve performing a cementing operation in accordance with the cement slurry recipe used in the last predictions of block 406, and which may be performed using one or more of the techniques shown in FIGS. 2 and 3, for example.

In one example, a first proposed cement slurry recipe may be selected which may include cement components and mass fractions thereof, water and mass fraction thereof. In this exemplary method, any of the cement performance property models of cement performance properties developed above may be utilized to calculate predicted performance properties for the first proposed cement slurry recipe. The calculated performance properties may be compared against one or more of the predetermined requirements. If the predicted performance properties satisfy (e.g., meet, exceed) the one or more predetermined requirements, the method may involve actually preparing a slurry based on the first proposed cement slurry recipe and tested using laboratory techniques to measure the performance properties to verify the cement slurry meets the performance properties control requirement. If, however, the predicted performance properties do not satisfy the performance requirements, the method may involve modifying the cement slurry recipe and re-running the predictions for the modified cement slurry recipe. As many iterations of re-running the predictions may be performed as needed until the method converges to a satisfactory solution, e.g., as sufficiently matching the predetermined requirements. Modifying the cement slurry recipe may include disparate cement components and/or disparate mass fractions thereof and or chemical additives and components thereof. One or more predicted performance properties of the second proposed cement slurry recipe may be compared to the one or more predetermined thresholds and if the predicted performance properties satisfy a desired performance metric, a slurry may be actually prepared based on the second proposed cement slurry recipe and either tested using laboratory techniques to ensure the performance properties actually satisfy the requisite properties, or may proceed directly to performing the wellbore operation without using laboratory techniques, in some examples. Otherwise, the method may be repeated until a cement slurry recipe that meets, exceeds, or stays below the requisite one or more performance properties requirements is met.

Cement slurries described herein may generally include a hydraulic cement and water. A variety of hydraulic cements may be utilized in accordance with the present disclosure, including, but not limited to, those comprising calcium, aluminum, silicon, oxygen, iron, and/or sulfur, which set and harden by reaction with water. Suitable hydraulic cements may include, but are not limited to, Portland cements, pozzolana cements, gypsum cements, high alumina content cements, silica cements, and any combination thereof. In certain examples, the hydraulic cement may include a Portland cement. In some examples, the Portland cements may include Portland cements that are classified as Classes A, C, H, and G cements according to American Petroleum Institute, *API Specification for Materials and Testing for Well Cements*, API Specification 10, Fifth Ed., Jul. 1, 1990. In addition, hydraulic cements may include cements classified by American Society for Testing and Materials (ASTM) in C150 (Standard Specification for Portland Cement), C595 (Standard Specification for Blended Hydraulic Cement) or C1157 (Performance Specification for Hydraulic Cements) such as those cements classified as ASTM Type I, II, or III. The hydraulic cement may be included in the cement slurry in any amount suitable for a particular composition. Without limitation, the hydraulic cement may be included in the cement slurries in an amount in the range of from about 10% to about 80% by weight of dry blend in the cement slurry. For example, the hydraulic cement may be present in an amount ranging between any of and/or including any of about 10%, about 15%, about 20%, about 25%, about 30%, about 35%, about 40%, about 45%, about 50%, about 55%, about 60%, about 65%, about 70%, about 75%, or about 80% by weight of the cement slurries.

The water may be from any source provided that it does not contain an excess of compounds that may undesirably affect other components in the cement slurries. For example, a cement slurry may include fresh water or saltwater. Saltwater generally may include one or more dissolved salts therein and may be saturated or unsaturated as desired for a particular application. Seawater or brines may be suitable for use in some examples. Further, the water may be present in an amount sufficient to form a pumpable slurry. In certain examples, the water may be present in the cement slurry in an amount in the range of from about 33% to about 200% by weight of the cementitious materials. For example, the water cement may be present in an amount ranging between any of and/or including any of about 33%, about 50%, about 75%, about 100%, about 125%, about 150%, about 175%, or about 200% by weight of the cementitious materials. The cementitious materials referenced may include all components which contribute to the compressive strength of the cement slurry such as the hydraulic cement and supplementary cementitious materials, for example.

As mentioned above, the cement slurry may include supplementary cementitious materials. The supplementary cementitious material may be any material that contributes to the desired properties of the cement slurry. Some supplementary cementitious materials may include, without limitation, fly ash, blast furnace slag, silica fume, pozzolans, kiln dust, and clays, for example.

The cement slurry may include kiln dust as a supplementary cementitious material. "Kiln dust," as that term is used herein, refers to a solid material generated as a by-product of the heating of certain materials in kilns. The term "kiln dust" as used herein is intended to include kiln dust made as described herein and equivalent forms of kiln dust. Depending on its source, kiln dust may exhibit cementitious properties in that it can set and harden in the presence of water. Examples of suitable kiln dusts include cement kiln dust, lime kiln dust, and combinations thereof. Cement kiln dust may be generated as a by-product of cement production that is removed from the gas stream and collected, for example, in a dust collector. Usually, large quantities of cement kiln dust are collected in the production of cement that are commonly disposed of as waste. The chemical analysis of the cement kiln dust from various cement manufactures varies depending on a number of factors, including the particular kiln feed, the efficiencies of the cement production operation, and the associated dust collection systems. Cement kiln dust generally may include a variety of oxides, such as $SiO_2$, $Al_2O_3$, $Fe_2O_3$, CaO, MgO, $SO_3$, $Na_2O$, and $K_2O$. The chemical analysis of lime kiln dust from various lime manufacturers varies depending on several factors, including the particular limestone or dolomitic limestone feed, the type of kiln, the mode of operation of the kiln, the efficiencies of the lime production operation, and the associated dust collection systems. Lime kiln dust generally may include varying amounts of free lime and free magnesium, limestone, and/or dolomitic limestone and a variety of oxides, such as $SiO_2$, $Al_2O_3$, $Fe_2O_3$, CaO, MgO, $SO_3$, $Na_2O$, and $K_2O$, and other components, such as chlorides. A cement kiln dust may be added to the cement slurry prior to, concurrently with, or after activation. Cement kiln dust may include a partially calcined kiln feed which is removed from the gas stream and collected in a dust collector during the manufacture of cement. The chemical analysis of CKD from various cement manufactures varies depending on several factors, including the particular kiln feed, the efficiencies of the cement production operation, and the associated dust collection systems. CKD generally may comprise a variety of oxides, such as $SiO_2$, $Al_2O_3$, $Fe_2O_3$, CaO, MgO, $SO_3$, $Na_2O$, and $K_2O$. The CKD and/or lime kiln dust may be included in examples of the cement slurry in an amount suitable for a particular application.

In some examples, the cement slurry may further include one or more of slag, natural glass, shale, amorphous silica, or metakaolin as a supplementary cementitious material. Slag is generally a granulated, blast furnace by-product from the production of cast iron including the oxidized impurities found in iron ore. The cement may further include shale. A variety of shales may be suitable, including those including silicon, aluminum, calcium, and/or magnesium. Examples of suitable shales include vitrified shale and/or calcined shale. In some examples, the cement slurry may further include amorphous silica as a supplementary cementitious material. Amorphous silica is a powder that may be included in embodiments to increase cement compressive strength. Amorphous silica is generally a byproduct of a ferrosilicon production process, wherein the amorphous silica may be formed by oxidation and condensation of gaseous silicon suboxide, SiO, which is formed as an intermediate during the process.

In some examples, the cement slurry may further include a variety of fly ashes as a supplementary cementitious material which may include fly ash classified as Class C, Class F, or Class N fly ash according to American Petroleum Institute, API Specification for Materials and Testing for Well Cements, API Specification 10, Fifth Ed., Jul. 1, 1990. In some examples, the cement slurry may further include zeolites as supplementary cementitious materials. Zeolites are generally porous alumino-silicate minerals that may be either natural or synthetic. Synthetic zeolites are based on the same type of structural cell as natural zeolites and may comprise aluminosilicate hydrates. As used herein, the term "zeolite" refers to all natural and synthetic forms of zeolite.

Where used, one or more of the aforementioned supplementary cementitious materials may be present in the cement slurry. For example, without limitation, one or more supplementary cementitious materials may be present in an amount of about 0.1% to about 80% by weight of the cement slurry. For example, the supplementary cementitious materials may be present in an amount ranging between any of and/or including any of about 0.1%, about 10%, about 20%, about 30%, about 40%, about 50%, about 60%, about 70%, or about 80% by weight of the cement.

In some examples, the cement slurry may further include hydrated lime. As used herein, the term "hydrated lime" will be understood to mean calcium hydroxide. In some embodiments, the hydrated lime may be provided as quicklime (calcium oxide) which hydrates when mixed with water to form the hydrated lime. The hydrated lime may be included in examples of the cement slurry, for example, to form a hydraulic composition with the supplementary cementitious components. For example, the hydrated lime may be included in a supplementary cementitious material-to-hydrated-lime weight ratio of about 10:1 to about 1:1 or 3:1 to about 5:1. Where present, the hydrated lime may be included in the set cement slurry in an amount in the range of from about 10% to about 100% by weight of the cement slurry, for example. In some examples, the hydrated lime may be present in an amount ranging between any of and/or including any of about 10%, about 20%, about 40%, about 60%, about 80%, or about 100% by weight of the cement slurry. In some examples, the cementitious components present in the cement slurry may consist essentially of one or more supplementary cementitious materials and the hydrated lime. For example, the cementitious components may primarily comprise the supplementary cementitious materials and the hydrated lime without any additional components (e.g., Portland cement, fly ash, slag cement) that hydraulically set in the presence of water.

Lime may be present in the cement slurry in several; forms, including as calcium oxide and or calcium hydroxide or as a reaction product such as when Portland cement reacts with water. Alternatively, lime may be included in the cement slurry by amount of silica in the cement slurry. A cement slurry may be designed to have a target lime to silica weight ratio. The target lime to silica ratio may be a molar ratio, molal ratio, or any other equivalent way of expressing a relative amount of silica to lime. Any suitable target time to silica weight ratio may be selected including from about 10/90 lime to silica by weight to about 40/60 lime to silica by weight. Alternatively, about 10/90 lime to silica by weight to about 20/80 lime to silica by weight, about 20/80 lime to silica by weight to about 30/70 lime to silica by weight, or about 30/70 lime to silica by weight to about 40/63 lime to silica by weight.

Other additives suitable for use in subterranean cementing operations also may be included in embodiments of the cement slurry. Examples of such additives include, but are not limited to: weighting agents, lightweight additives, gas-generating additives, mechanical-property-enhancing additives, lost-circulation materials, filtration-control additives, fluid-loss-control additives, defoaming agents, foaming agents, thixotropic additives, and combinations thereof. In embodiments, one or more of these additives may be added to the cement slurry after storing but prior to the placement of a cement slurry into a subterranean formation. In some examples, the cement slurry may further include a dispersant. Examples of suitable dispersants include, without limitation, sulfonated-formaldehyde-based dispersants (e.g., sulfonated acetone formaldehyde condensate) or polycarboxylated ether dispersants. In some examples, the dispersant may be included in the cement slurry in an amount in the range of from about 0.01% to about 5% by weight of the cementitious materials. In specific examples, the dispersant may be present in an amount ranging between any of and/or including any of about 0.01%, about 0.1%, about 0.5%, about 1%, about 2%, about 3%, about 4%, or about 5% by weight of the cementitious materials.

In some examples, the cement slurry may further include a set retarder. A broad variety of set retarders may be suitable for use in the cement slurries. For example, the set retarder may comprise phosphonic acids, such as ethylenediamine tetra(methylene phosphonic acid), diethylenetriamine penta (methylene phosphonic acid), etc.; lignosulfonates, such as sodium lignosulfonate, calcium lignosulfonate, etc.; salts such as stannous sulfate, lead acetate, monobasic calcium phosphate, organic acids, such as citric acid, tartaric acid, etc.; cellulose derivatives such as hydroxyl ethyl cellulose (HEC) and carboxymethyl hydroxyethyl cellulose (CMHEC); synthetic co- or ter-polymers comprising sulfonate and carboxylic acid groups such as sulfonate-functionalized acrylamide-acrylic acid co-polymers; borate compounds such as alkali borates, sodium metaborate, sodium tetraborate, potassium pentaborate; derivatives thereof, or mixtures thereof. Examples of suitable set retarders include, among others, phosphonic acid derivatives. Generally, the set retarder may be present in the cement slurry in an amount sufficient to delay the setting for a desired time. In some examples, the set retarder may be present in the cement slurry in an amount in the range of from about 0.01% to about 10% by weight of the cementitious materials. In specific examples, the set retarder may be present in an amount ranging between any of and/or including any of about 0.01%, about 0.1%, about 1%, about 2%, about 4%, about 6%, about 8%, or about 10% by weight of the cementitious materials.

In some examples, the cement slurry may further include an accelerator. A broad variety of accelerators may be suitable for use in the cement slurries. For example, the accelerator may include, but are not limited to, aluminum sulfate, alums, calcium chloride, calcium nitrate, calcium nitrite, calcium formate, calcium sulphoaluminate, calcium sulfate, gypsum-hemihydrate, sodium aluminate, sodium carbonate, sodium chloride, sodium silicate, sodium sulfate, ferric chloride, or a combination thereof. In some examples, the accelerators may be present in the cement slurry in an amount in the range of from about 0.01% to about 10% by weight of the cementitious materials. In specific examples, the accelerators may be present in an amount ranging between any of and/or including any of about 0.01%, about 0.1%, about 1%, about 2%, about 4%, about 6%, about 8%, or about 10% by weight of the cementitious materials.

Cement slurries generally should have a density suitable for a particular application. By way of example, the cement slurry may have a density in the range of from about 8 pounds per gallon ("ppg") (959 kg/$m^3$) to about 20 ppg (2397 kg/$m^3$), or about 8 ppg to about 12 ppg (1437. kg/$m^3$), or about 12 ppg to about 16 ppg (1917.22 kg/$m^3$), or about 16 ppg to about 20 ppg, or any ranges therebetween. Examples of the cement slurry may be foamed or unfoamed or may comprise other means to reduce their densities, such as hollow microspheres, low-density elastic beads, or other density-reducing additives known in the art.

The cement slurries disclosed herein may be used in a variety of subterranean applications, including primary and remedial cementing. The cement slurries may be introduced into a subterranean formation and allowed to set. In primary cementing applications, for example, the cement slurries may be introduced into the annular space between a conduit located in a wellbore and the walls of the wellbore (and/or a larger conduit in the wellbore), wherein the wellbore penetrates the subterranean formation. The cement slurry may be allowed to set in the annular space to form an annular sheath of hardened cement. The cement slurry may form a barrier that prevents the migration of fluids in the wellbore. The cement slurry may also, for example, support the conduit in the wellbore. In remedial cementing applications, the cement slurry may be used, for example, in squeeze cementing operations or in the placement of cement plugs. By way of example, the cement slurry may be placed in a wellbore to plug an opening (e.g., a void or crack) in the formation, in a gravel pack, in the conduit, in the cement sheath, and/or between the cement sheath and the conduit (e.g., a micro annulus).

In one or more examples, one or more blocks of workflow 400 may comprise, or be proceeded by, measuring performance properties of one or more sample cements. This may be performed to provide sufficient data for a training dataset used to train one or more of the cement performance property models, in some examples. In some examples, however, training data may be retrieved from a database comprising historical data from previous laboratory tests or prior cementing operations. Measuring performance properties of each selected cement component may include many laboratory techniques and procedures including, but not limited to, various destructive and/or non-destructive tests. These tests may include API tests, as set forth in the API recommended practice for testing well cements (published as ANSI/API recommended practice 10B-2). Other non-limiting examples of various laboratory techniques used in some examples to determine performance properties may include microscopy, spectroscopy, x-ray diffraction, x-ray fluorescence, particle size analysis, water requirement analysis, scanning electron microscopy, energy-dispersive X-ray spectroscopy, surface area, specific gravity analysis, thermogravimetric analysis, morphology analysis, infrared spectroscopy, ultraviolet-visible spectroscopy, mass spectroscopy, secondary ion mass spectrometry, electron energy mass spectrometry, dispersive x-ray spectroscopy, auger electron spectroscopy, inductively coupled plasma analysis, thermal ionization mass spectroscopy, glow discharge mass spectroscopy x-ray photoelectron spectroscopy, rheological properties, and combinations thereof.

The cement components herein disclosed may be analyzed in some examples to determine their water requirement. Water requirement is typically defined as the amount of mixing water that is required to be added to a powdered, solid particulate material to form a slurry of a specified consistency. Water requirement for a particular cement component may be determined by a process that includes a) preparing a Waring blender with a specified amount of water, b) agitating the water at a specified blender rpm, c) adding the powdered solid that is being investigated to the water until a specified consistency is obtained, and d) calculating the water requirement based on the ratio of water to solids required to reach the desired consistency.

In addition to measuring performance properties of cement, laboratory tests may also be run to determine behavior of the cement components in a cement slurry. For example, cement components may be analyzed in a cement slurry to determine their compressive strength development and mechanical properties. For example, a preselected amount of the cement component may be combined with water and lime (if needed for setting). The performance properties of the cement slurry may then be determined including compressive strength, tensile strength, and Young's modulus. Any of a variety of different conditions may be used for the testing so long as the conditions are consistent for the different cement components.

Figure 16:
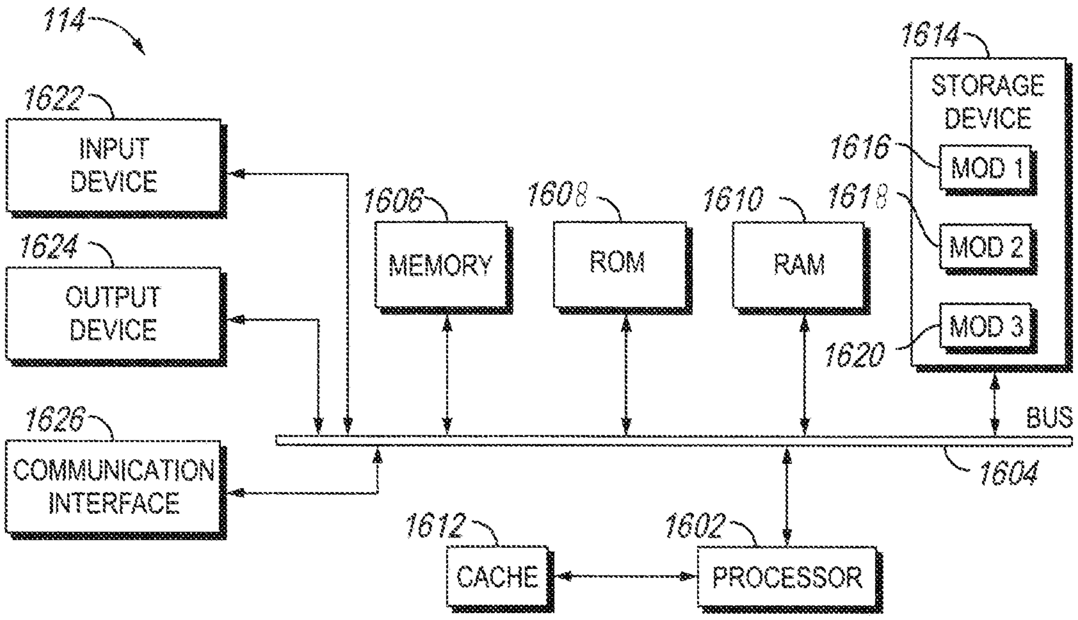
FIG. 16 illustrates an example information handling system, in accordance with one or more embodiments of the present disclosure.

FIG. 16 illustrates an example information handling system 114 which may be employed to perform various steps, methods, and techniques disclosed herein. Persons of ordinary skill in the art will readily appreciate that other system examples are possible. As illustrated, information handling system 114 includes a processing unit (CPU or processor) 1602 and a system bus 1604 that couples various system components including system memory 1606 such as read only memory (ROM) 1608 and random-access memory (RAM) 1610 to processor 1602. Processors disclosed herein may all be forms of this processor 1602. Information handling system 114 may include a cache 1612 of high-speed memory connected directly with, in close proximity to, or integrated as part of processor 1602. Information handling system 114 copies data from memory 1606 and/or storage device 1614 to cache 1612 for quick access by processor 1602. In this way, cache 1612 provides a performance boost that avoids processor 1602 delays while waiting for data. These and other modules may control or be configured to control processor 1602 to perform various operations or actions. Another system memory 1606 may be available for use as well. Memory 1606 may include multiple different types of memory with different performance characteristics. It may be appreciated that the disclosure may operate on information handling system 114 with more than one processor 1602 or on a group or cluster of computing devices networked together to provide greater processing capability. Processor 1602 may include any general-purpose processor and a hardware module or software module, such as first module 1616, second module 1618, and third module 1620 stored in storage device 1614, configured to control processor 1602 as well as a special-purpose processor where software instructions are incorporated into processor 1602.

Processor 1602 may be a self-contained computing system, containing multiple cores or processors, a bus, memory controller, cache, etc. A multi-core processor may be symmetric or asymmetric. Processor 1602 may include multiple processors, such as a system having multiple, physically separate processors in different sockets, or a system having multiple processor cores on a single physical chip. Similarly, processor 1602 may include multiple distributed processors located in multiple separate computing devices but working together such as via a communications network. Multiple processors or processor cores may share resources such as memory 1606 or cache 1612 or may operate using independent resources. Processor 1602 may include one or more state machines, an application specific integrated circuit (ASIC), or a programmable gate array (PGA) including a field PGA (FPGA).

Each individual component discussed above may be coupled to system bus 1604, which may connect each and every individual component to each other. System bus 1604 may be any of several types of bus structures including a memory bus or memory controller, a peripheral bus, and a local bus using any of a variety of bus architectures. A basic input/output (BIOS) stored in ROM 1608 or the like, may provide the basic routine that helps to transfer information between elements within information handling system 114, such as during start-up. Information handling system 114 further includes storage devices 1614 or computer-readable storage media such as a hard disk drive, a magnetic disk drive, an optical disk drive, tape drive, solid-state drive, RAM drive, removable storage devices, a redundant array of inexpensive disks (RAID), hybrid storage device, or the like. Storage device 1614 may include software modules 1616, 1618, and 1620 for controlling processor 1602. Information handling system 114 may include other hardware or software modules. Storage device 1614 is connected to the system bus 1604 by a drive interface. The drives and the associated computer-readable storage devices provide non-volatile storage of computer-readable instructions, data structures, program modules and other data for information handling system 114. In one aspect, a hardware module that performs a particular function includes the software component stored in a tangible computer-readable storage device in connection with the necessary hardware components, such as processor 1602, system bus 1604, and so forth, to carry out a particular function. In another aspect, the system may use a processor and computer-readable storage device to store instructions which, when executed by the processor, cause the processor to perform operations, a method or other specific actions. The basic components and appropriate variations may be modified depending on the type of device, such as whether information handling system 114 is a small, handheld computing device, a desktop computer, or a computer server. When processor 1602 executes instructions to perform "operations", processor 1602 may perform the operations directly and/or facilitate, direct, or cooperate with another device or component to perform the operations.

As illustrated, information handling system 114 employs storage device 1614, which may be a hard disk or other types of computer-readable storage devices which may store data that are accessible by a computer, such as magnetic cassettes, flash memory cards, digital versatile disks (DVDs), cartridges, random access memories (RAMs) 1610, read only memory (ROM) 1608, a cable containing a bit stream and the like, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with information handling system 114, an input device 1622 represents any number of input mechanisms, such as a microphone for speech, a touch-sensitive screen for gesture or graphical input, keyboard, mouse, motion input, speech and so forth. An output device 1624 may also be one or more of a number of output mechanisms known to those of skill in the art. In some instances, multimodal systems enable a user to provide multiple types of input to communicate with information handling system 114. Communications interface 1626 generally governs and manages the user input and system output. There is no restriction on operating on any particular hardware arrangement and therefore the basic hardware depicted may easily be substituted for improved hardware or firmware arrangements as they are developed.

As illustrated, each individual component described above is depicted and disclosed as individual functional blocks. The functions these blocks represent may be provided through the use of either shared or dedicated hardware, including, but not limited to, hardware capable of executing software and hardware, such as a processor 1602, that is purpose-built to operate as an equivalent to software executing on a general-purpose processor. For example, the functions of one or more processors presented in FIG. 16 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 308 for storing software performing the operations described below, and random-access memory (RAM) 310 for storing results. Very large-scale integration (VLSI) hardware embodiments, as well as custom VLSI circuitry in combination with a general-purpose DSP circuit, may also be provided.

The logical operations of the various methods, described below, are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. Information handling system 114 may practice all or part of the recited methods, may be a part of the recited systems, and/or may operate according to instructions in the recited tangible computer-readable storage devices. Such logical operations may be implemented as modules configured to control processor 1602 to perform particular functions according to the programming of software modules 1616, 1618, and 1620.

In examples, one or more parts of the example information handling system 114, up to and including the entire information handling system 114, may be virtualized. For example, a virtual processor may be a software object that executes according to a particular instruction set, even when a physical processor of the same type as the virtual processor is unavailable. A virtualization layer or a virtual "host" may enable virtualized components of one or more different computing devices or device types by translating virtualized operations to actual operations. Ultimately however, virtualized hardware of every type is implemented or executed by some underlying physical hardware. Thus, a virtualization computer layer may operate on top of a physical computer layer. The virtualization computer layer may include one or more virtual machines, an overlay network, a hypervisor, virtual switching, and any other virtualization application.

Figure 17:
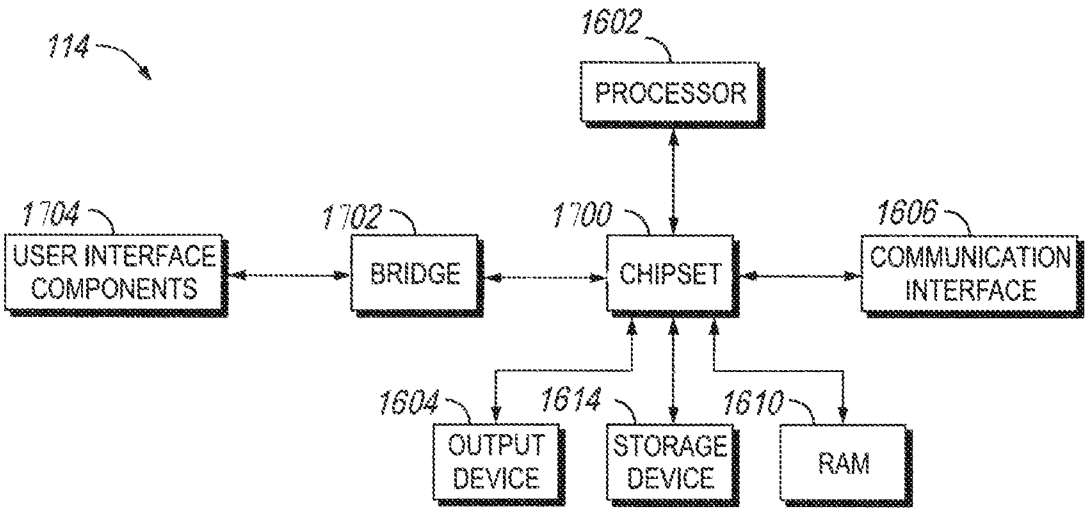
FIG. 17 illustrates an example information handing system, in accordance with one or more embodiments of the present disclosure.

FIG. 17 illustrates an example information handling system 114 having a chipset architecture that may be used in executing the described method and generating and displaying a graphical user interface (GUI). Information handling system 114 is an example of computer hardware, software, and firmware that may be used to implement the disclosed technology. Information handling system 114 may include a processor 1602, representative of any number of physically and/or logically distinct resources capable of executing software, firmware, and hardware configured to perform identified computations. Processor 1602 may communicate with a chipset 1700 that may control input to and output from processor 1602. In this example, chipset 1700 outputs information to output device 1624, such as a display, and may read and write information to storage device 1614, which may include, for example, magnetic media, and solid-state media. Chipset 1700 may also read data from and write data to RAM 1610. Bridge 1702 for interfacing with a variety of user interface components 1704 may be provided for interfacing with chipset 1700. User interface components 1704 may include a keyboard, a microphone, touch detection and processing circuitry, a pointing device, such as a mouse, and so on. In general, inputs to information handling system 114 may come from any of a variety of sources, machine generated and/or human generated.

Chipset 1700 may also interface with one or more communication interfaces 1626 that may have different physical interfaces. Such communication interfaces may include interfaces for wired and wireless local area networks, for broadband wireless networks, as well as personal area networks. Some applications of the methods for generating, displaying, and using the GUI disclosed herein may include receiving ordered datasets over the physical interface or be generated by the machine itself by processor 1602 analyzing data stored in storage device 1614 or RAM 1610. Further, information handling system 114 receives inputs from a user via user interface components 1704 and executes appropriate functions, such as browsing functions by interpreting these inputs using processor 1602.

In examples, information handling system 114 may also include tangible and/or non-transitory computer-readable storage devices for carrying or having computer-executable instructions or data structures stored thereon. Such tangible computer-readable storage devices may be any available device that may be accessed by a general purpose or special purpose computer, including the functional design of any special purpose processor as described above. By way of example, and not limitation, such tangible computer-readable devices may include RAM, ROM, EEPROM, CD-ROM or other optical disk storage, magnetic disk storage or other magnetic storage devices, or any other device which may be used to carry or store desired program code in the form of computer-executable instructions, data structures, or processor chip design. When information or instructions are provided via a network, or another communications connection (either hardwired, wireless, or combination thereof), to a computer, the computer properly views the connection as a computer-readable medium. Thus, any such connection is properly termed a computer-readable medium. Combinations of the above should also be included within the scope of the computer-readable storage devices.

In examples, information handling system 114 may also include tangible and/or non-transitory computer-readable storage devices for carrying or having computer-executable instructions or data structures stored thereon. The non-transitory computer readable media 148 may store software or instructions of the methods described herein. Non-transitory computer readable media 148 may include any instrumentality or aggregation of instrumentalities that may retain data and/or instructions for a period of time. Non-transitory computer readable media 148 may include, for example, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

Such tangible computer-readable storage devices may be any available device that may be accessed by a general purpose or special purpose computer, including the functional design of any special purpose processor as described above. By way of example, and not limitation, such tangible computer-readable devices may include RAM, ROM, EEPROM, CD-ROM or other optical disk storage, magnetic disk storage or other magnetic storage devices, or any other device which may be used to carry or store desired program code in the form of computer-executable instructions, data structures, or processor chip design. When information or instructions are provided via a network, or another communications connection (either hardwired, wireless, or combination thereof), to a computer, the computer properly views the connection as a computer-readable medium. Thus, any such connection is properly termed a computer-readable medium. Combinations of the above should also be included within the scope of the computer-readable storage devices.

Computer-executable instructions include, for example, instructions and data which cause a general-purpose computer, special purpose computer, or special purpose processing device to perform a certain function or group of functions. Computer-executable instructions also include program modules that are executed by computers in standalone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

In additional examples, methods may be practiced in network computing environments with many types of computer system configurations, including personal computers, hand-held devices, multi-processor systems, microprocessor-based or programmable consumer electronics, network PCs, minicomputers, mainframe computers, and the like. Examples may also be practiced in distributed computing environments where tasks are performed by local and remote processing devices that are linked (either by hardwired links, wireless links, or by a combination thereof) through a communications network. In a distributed computing environment, program modules may be located in both local and remote memory storage devices.

Figure 18:
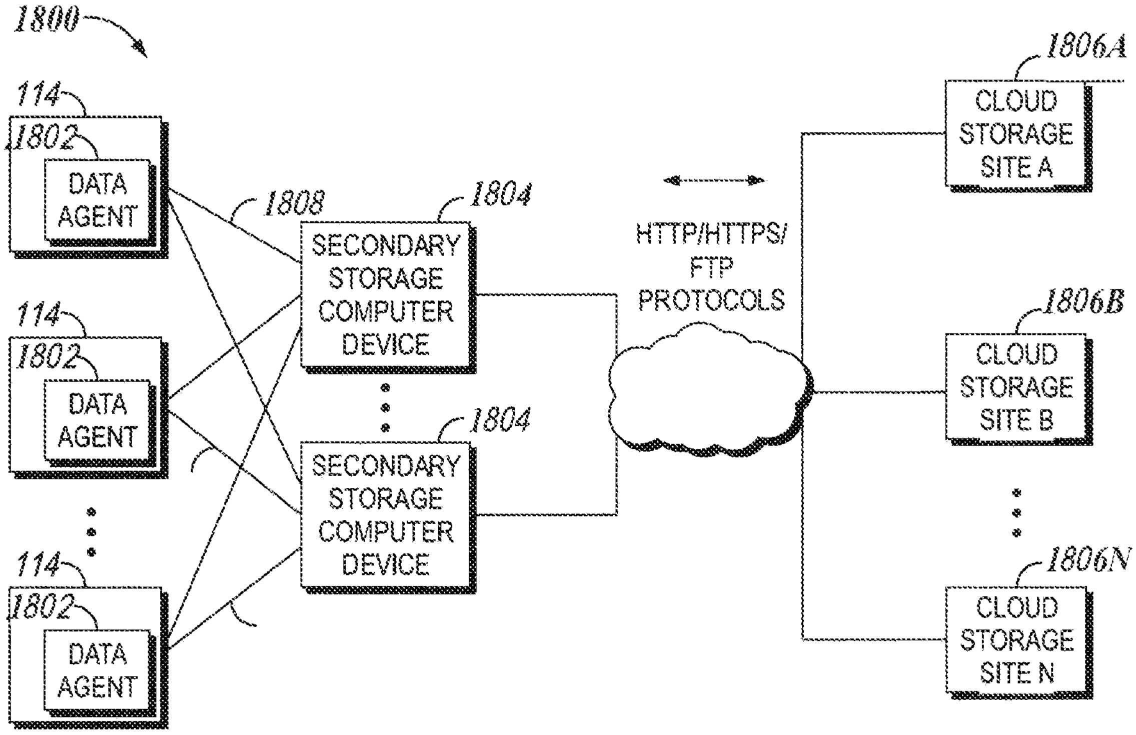
FIG. 18 illustrates an example of one arrangement of resources in a computing network, in accordance with one or more embodiments of the present disclosure.

FIG. 18 illustrates an example of one arrangement of resources in a computing network 1800 that may employ the processes and techniques described herein, although many others are of course possible. As noted above, an information handling system 114, as part of their function, may utilize data, which includes files, directories, metadata (e.g., access control list (ACLS) creation/edit dates associated with the data, etc.), and other data objects. The data on the information handling system 114 is typically a primary copy (e.g., a production copy). During a copy, backup, archive or other storage operation, information handling system 114 may send a copy of some data objects (or some components thereof) to a secondary storage computing device 1804 by utilizing one or more data agents 1802.

A data agent 1802 may be a desktop application, website application, or any software-based application that is run on information handling system 114. As illustrated, information handling system 114 may be disposed at any rig site (e.g., referring to FIG. 1) or repair and manufacturing center. Data agent 1802 may communicate with a secondary storage computing device 1804 using communication protocol 1808 in a wired or wireless system. Communication protocol 1808 may function and operate as an input to a website application. In the website application, field data related to pre- and post-operations, generated DTCs, notes, and the like may be uploaded. Additionally, information handling system 114 may utilize communication protocol 1808 to access processed measurements, operations with similar DTCs, troubleshooting findings, historical run data, and/or the like. This information is accessed from secondary storage computing device 1804 by data agent 1802, which is loaded on information handling system 114.

Secondary storage computing device 1804 may operate and function to create secondary copies of primary data objects (or some components thereof) in various cloud storage sites 1806A-N. Additionally, secondary storage computing device 1804 may run determinative algorithms on data uploaded from one or more information handling systems 138, discussed further below. Communications between the secondary storage computing devices 1804 and cloud storage sites 1806A-N may utilize REST protocols (Representational state transfer interfaces) that satisfy basic C/R/U/D semantics (Create/Read/Update/Delete semantics), or other hypertext transfer protocol ("HTTP")-based or file-transfer protocol ("FTP")-based protocols (e.g., Simple Object Access Protocol).

In conjunction with creating secondary copies in cloud storage sites 1806A-N, the secondary storage computing device 1804 may also perform local content indexing and/or local object-level, sub-object-level or block-level deduplication when performing storage operations involving various cloud storage sites 1806A-N. Cloud storage sites 1806A-N may further record and maintain DTC code logs for each downhole operation or run, map DTC codes, store repair and maintenance data, store operational data, and/or provide outputs from determinative algorithms that are run at cloud storage sites 1806A-N. As previously described, information handling system 114 may be operable via telemetry techniques to receive downhole measurements at surface 108.

The following statements may describe certain embodiments of the disclosure but should be read to be limiting to any particular embodiment.

Statement 1: A method of designing a cement slurry comprising: (a) providing cement design requirements for the cement slurry wherein the cement design requirements comprise at least one cement performance property selected from the group consisting of compressive strength, tensile strength, cohesion, friction angle, Young's modulus, Poisson's ratio, and any combination thereof; (b) providing a virtual cement slurry recipe representing at least water and a concentration thereof and one or more cementitious materials and a concentration thereof; (c) inputting at least a well condition and the virtual cement slurry into a cement performance property model; (d) predicting performance properties for the virtual cement slurry recipe using at least the cement performance property model, wherein the performance properties comprise at least one of compressive strength, tensile strength, cohesion, friction angle, Young's modulus, and Poisson's ratio; (e) comparing the predicted performance properties to the cement design requirements; and (f) preparing a cement slurry according to the virtual cement slurry recipe if the predicted performance properties for the virtual cement slurry recipe satisfy the cement design requirements or repeating (b)-(f) if the virtual cement slurry recipe does not satisfy the cement design requirements, where the step of providing the virtual cement slurry recipe comprises providing a virtual cement slurry recipe with a disparate concentration of water, a disparate concentration of one or more of the cementitious materials, and/or a disparate chemical identity of the one or more cementitious materials.

Statement 2: The method of statement 1, wherein the performance properties further comprise fluid loss and thickening time.

Statement 3: The method of statements 1 or 2, wherein the virtual cement slurry recipe further represents at least one cement additive selected from the group consisting of an accelerator, a retarder, latex, polyvinyl alcohol, crystalline silica, and any combination thereof.

Statement 4: The method of any of statements 1-3, wherein the cement performance property model comprises a neural network, a decision tree, or a random forest model.

Statement 5: The method of any of statements 1-4, wherein the method further comprises training one or more machine learning algorithms using training data to form the cement performance property model, wherein the training data comprises a plurality of cement composition data and cement property comprising ultimate compressive strength, tensile strength, friction angle, cohesion, Young's modulus, and Poisson's ratio for each of the plurality of cement composition data.

Statement 6: The method of any of statements 1-5, wherein the one or more cementitious materials comprise at least one pozzolanic material selected from the group consisting of fly ash, pumice, silicalite, cement kiln dust, and any combination thereof.

Statement 7: The method of any of statements 1-6, wherein the cement slurry comprises at least one density modifier selected from the group consisting of a light weight bead, a heavy weight metal oxide, an elastomer, a fiber, and any combination thereof.

Statement 8: The method of any of statements 1-7, wherein the well condition comprises curing temperature, a curing pressure, a curing time, and a confining pressure.

Statement 9: The method of any of statements 1-8, wherein the predicted performance properties comprise friction angle, and wherein the friction angle is predicted using measurements of ultimate compressive strength and cohesion.

Statement 10: The method of any of statements 1-9, wherein the predicted performance properties comprise ultimate compressive strength and cohesion, wherein the method further comprises determining friction angle from the predictions of ultimate compressive strength and cohesion.

Statement 11: The method of statement 10, wherein determining the friction angle comprises using an equation having the form $$\text{Cohesion} = \frac{UCS}{2}\left(\frac{1-\sin\varphi}{\cos\varphi}\right)$$

where UCS is the predicted ultimate compression strength, Cohesion is predicted cohesion, and φ is the friction angle.

Statement 12: The method of statement 10, wherein the cement slurry is prepared according to the new cement slurry recipe if the predicted friction angle is greater than or equal to a friction angle requirement.

Statement 13: The method of any of statements 1-12, wherein the cement performance property model comprises a linear model having the form:

$$C_l = a_0\left(\frac{w}{\text{Mass }Poz}\right) + \sum_i\left(\frac{Vol_i}{Vol\,Poz}\right)a_i + \sum_j\left(\frac{\text{Mass Add}_j}{\text{Mass }Poz}\right)a_j + \sum_k\left(\frac{\text{Mass blend}_k}{\text{Mass }Poz}\right)a_k + \sum_l(\text{Well }Cond_l)a_l$$

where $C_l$ is a performance property of a cement, w is mass of water, Mass Poz is mass of pozzolans, Vol Poz is a volume of pozzolans, Voli is volume of pozzolanic species i, Mass Addj is the mass of an additive j, mass blendk is the mass of a blend species k, Well Condl is a well condition l, and a0, ai, aj, ak, and al are constants.

Statement 14: The method of any of statements 1-13, wherein the cement performance property model comprises a non-linear model having the form:

$$C_l = a_0\left(\frac{w}{\text{Mass }Poz}\right)^a + e^{\sum_i\left(\frac{Vol_i}{Vol\,Poz}\right)a_i} + e^{\sum_j\left(\frac{Mass\,Add_j}{Mass\,Poz}\right)a_j} + e^{\sum_k\left(\frac{Mass\,blend_k}{Mass\,Poz}\right)a_k} + e^{\sum_l(Well\,Cond_l)a_l}$$

where $C_l$ is a performance property of a cement, w is mass of water, Mass Poz is mass of pozzolans, Vol Poz is a volume of pozzolans, Voli is volume of pozzolanic species i, Mass Addj is the mass of an additive j, mass blendk is the mass of a blend species k, Well Condl is a well condition l, and a0, ai, aj, ak, and al are constants.

Statement 15: The method of any of statements 1-14, further comprising introducing the cement slurry in a subterranean formation.

Statement 16: A method of designing a cement slurry comprising: (a) providing cement design requirements for the cement slurry wherein the cement design requirements comprise at least one cement performance property selected from the group consisting of compressive strength, tensile strength, cohesion, friction angle, Young's modulus, Poisson's ratio, and any combination thereof; (b) providing a virtual cement slurry recipe representing at least water and a concentration thereof and one or more cementitious materials and a concentration thereof; (c) inputting at least a curing temperature, a curing pressure, a curing time, a confining pressure into a cement performance property model, and the virtual cement slurry into a cement performance property model; (d) predicting performance properties for the virtual cement slurry using the cement performance property model, wherein the performance properties comprise at least one of compressive strength, tensile strength, cohesion, friction angle, Young's modulus, and Poisson's ratio; (e) comparing the predicted performance properties to the cement design requirements; and (f) modifying the virtual cement slurry recipe if the predicted performance properties to the cement design requirements, wherein the modifying comprises forming a new virtual cement slurry with a different concentration for at least one of the one or more cementitious materials or preparing a cement slurry according to the virtual cement slurry recipe if the predicted performance properties meet or exceed the cement design requirements.

Statement 17: The method of statement 16, wherein the cement performance property model comprises a neural network, a tree-based model, or a random forest model.

Statement 18: The method of statement 17, wherein the cement performance property model comprises a linear model having the form:

$$C_l = a_0\left(\frac{w}{\text{Mass } Poz}\right) + \sum_i \left(\frac{Vol_i}{Vol\,Poz}\right)a_i + \sum_j \left(\frac{\text{Mass Add}_j}{\text{Mass } Poz}\right)a_j + \sum_k \left(\frac{\text{Mass blend}_k}{\text{Mass } Poz}\right)a_k + \sum_l (\text{Well } Cond_l)a_l$$

where $C_l$ is a performance property of a cement, w is mass of water, Mass Poz is mass of pozzolans, Vol Poz is a volume of pozzolans, Voli is volume of pozzolanic species i, Mass Addj is the mass of an additive j, mass blendk is the mass of a blend species k, Well Condl is a well condition l, and a0, ai, aj, ak, and al are constants.

Statement 19: The method of any of statements 16-18, wherein the cement performance property model comprises a non-linear model having the form:

$$C_l = a_0\left(\frac{w}{\text{Mass } Poz}\right)^a + e^{\sum_i \left(\frac{Vol_i}{Vol\,Poz}\right)a_i} + e^{\sum_j \left(\frac{Mass\,Add_j}{Mass\,Poz}\right)a_j} + e^{\sum_k \left(\frac{Mass\,blend_k}{Mass\,Poz}\right)a_k} + e^{\sum_l (Well\,Cond_l)a_l}$$

where $C_l$ is a performance property of a cement, w is mass of water, Mass Poz is mass of pozzolans, Vol Poz is a volume of pozzolans, Voli is volume of pozzolanic species i, Mass Addj is the mass of an additive j, mass blendk is the mass of a blend species k, Well Condl is a well condition l, and a0, ai, aj, ak, and al are constants.

Statement 20: The method of statement 13 further comprising introducing the cement slurry in a subterranean formation.

To facilitate a better understanding of the present invention, the following examples of certain aspects of some embodiments are given. In no way should the following examples be read to limit, or define, the entire scope of the disclosure.

EXAMPLE

In this example, a random forest model was trained using historical cement data which included cement slurry composition, slurry physical properties, set cement physical properties, and placement conditions in the wellbore. The compositions were of diverse designs with varying types of cement, supplementary cementitious materials, and densities. FIGS. 5-15 show parity plots of measured properties from the historical cement data versus predicted properties from the random forest model.

Figure 5:
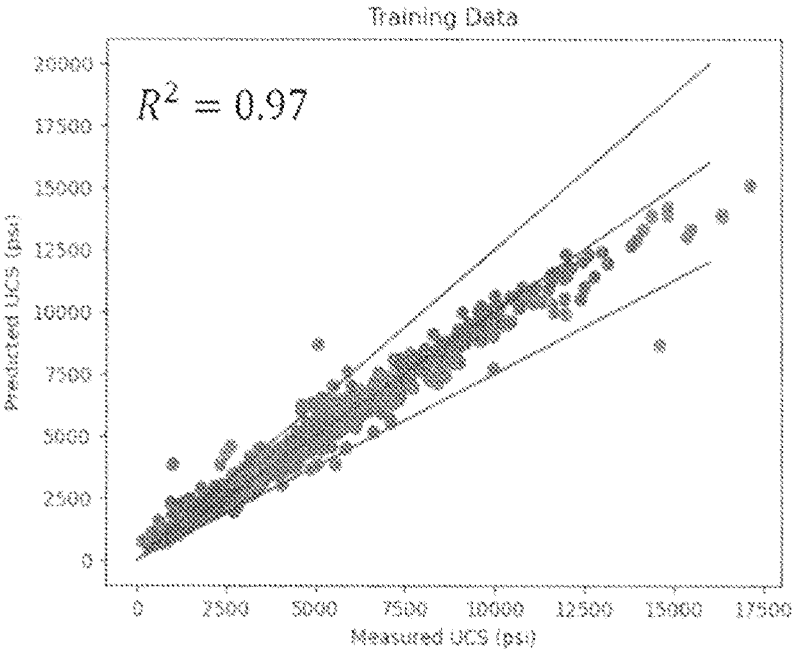
FIG. 5 is a parity plot of training data comprising predicted versus measured ultimate compressive strength for training a cement performance property model using a plurality of cement barrier designs, in accordance with one or more embodiments of the present disclosure.
Figure 6:
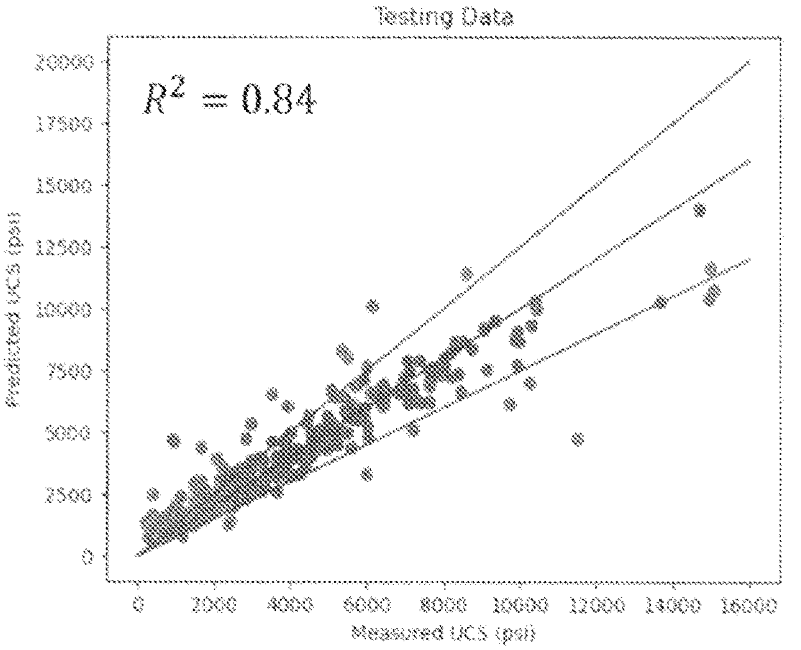
FIG. 6 is a parity plot of testing data to test the predictions of the cement performance property model trained in FIG. 5, and which also comprises predicted versus measured ultimate compressive strength for a plurality of cement barrier designs, in accordance with one or more embodiments of the present disclosure.

FIG. 5 is a parity plot of training data comprising predicted versus measured ultimate compressive strength of a plurality of cement barrier designs, for training a cement performance property model using a plurality of cement barrier designs, in accordance with one or more embodiments of the present disclosure. In the illustrated example, a random forest cement performance property model was built to relate ultimate compressive strength to composition, curing, and testing conditions. FIG. 6 is a parity plot of testing data to test the cement performance property model predictions of the cement performance property model trained in FIG. 5, and which also comprises predicted versus measured ultimate compressive strength. Each datapoint in FIG. 6 represents a prediction by the trained cement performance property model of FIG. 5 for a unique cement barrier design.

Figure 7:
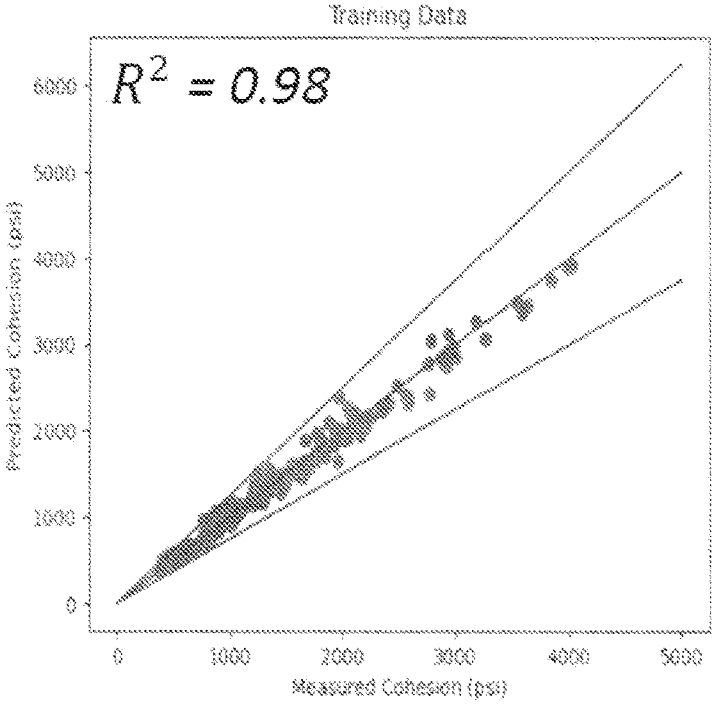
FIG. 7 is a parity plot of training data comprising predicted versus measured Cohesion for training a cement performance property model using a plurality of cement barrier designs, in accordance with one or more embodiments of the present disclosure.
Figure 8:
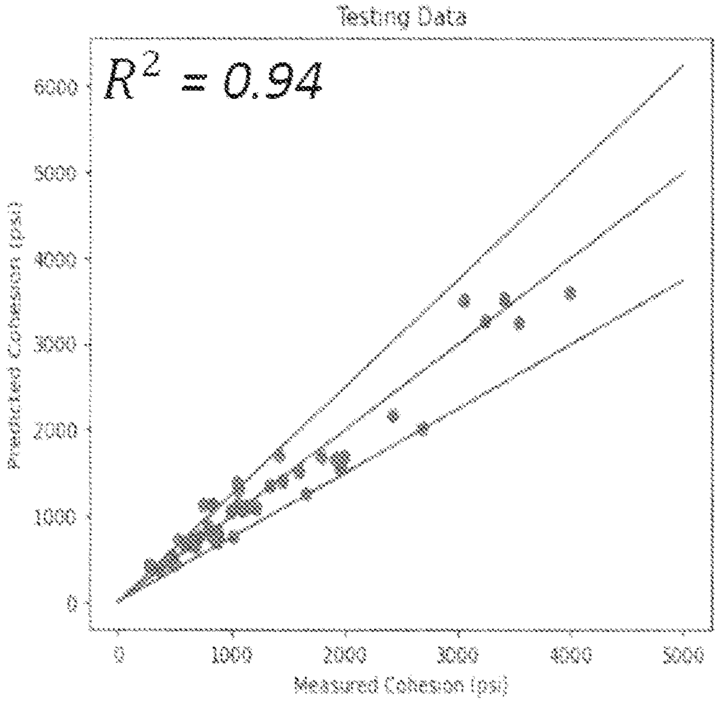
FIG. 8 is a parity plot of testing data to show the predictions of the cement performance property model trained in FIG. 7, and which also comprises predicted versus measured Cohesion for a plurality of cement barrier designs, in accordance with one or more embodiments of the present disclosure.

FIG. 7 is a parity plot of training data comprising predicted versus measured cohesion for training a cement performance property model using a plurality of cement barrier designs, in accordance with one or more embodiments of the present disclosure. In the illustrated example, a random forest cement performance property model was built to relate cohesion to composition, curing, and testing conditions. FIG. 8 is a parity plot of testing data to show the cement performance property model predictions of the cement performance property model trained in FIG. 7, and which also comprises predicted versus measured cohesion for a plurality of cement barrier designs, in accordance with one or more embodiments of the present disclosure. Each datapoint in FIG. 8 represents a prediction by the trained cement performance property model of FIG. 7 for a unique cement barrier design.

Figure 9:
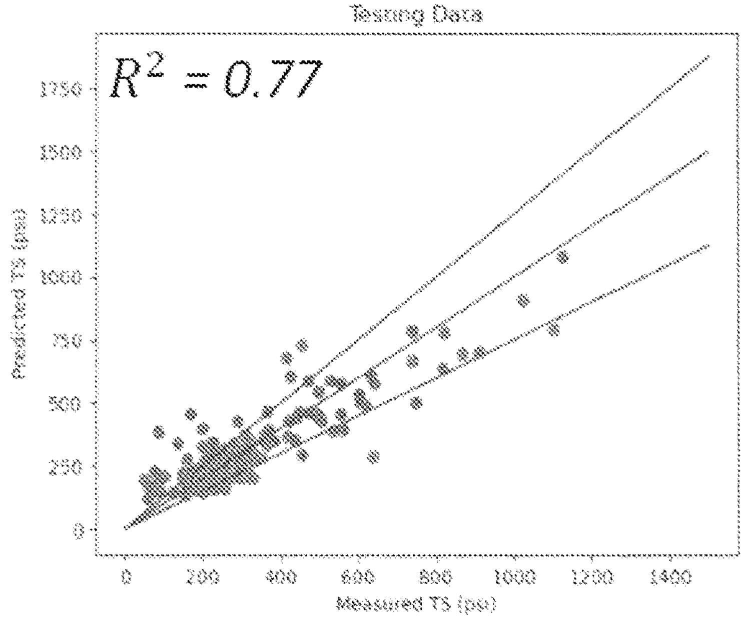
FIG. 9 is a parity plot of training data comprising predicted versus measured Tensile strength for training a cement performance property model using a plurality of cement barrier designs, in accordance with one or more embodiments of the present disclosure.
Figure 10:
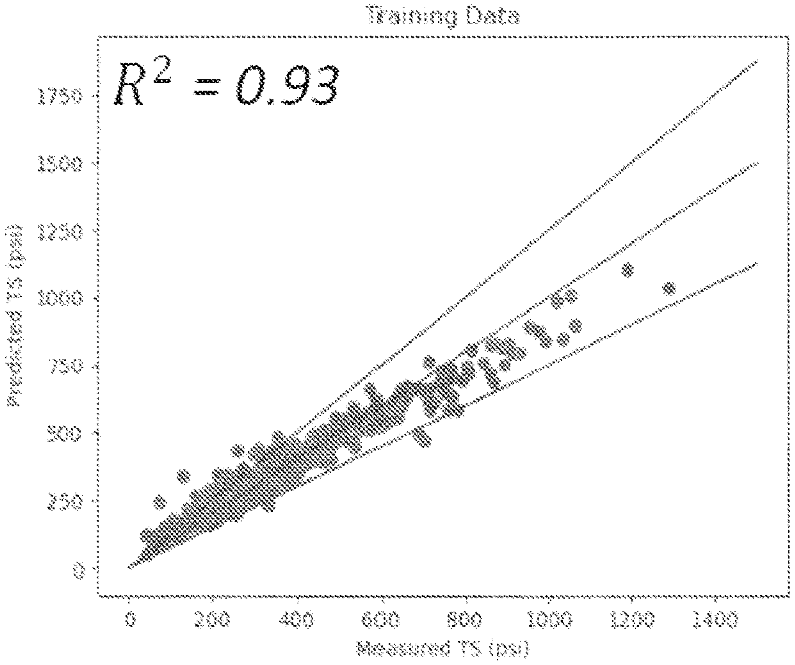
FIG. 10 is a parity plot of testing data to show the predictions of the cement performance property model trained in FIG. 9, and which also comprises predicted versus measured Tensile strength for a plurality of cement barrier designs, in accordance with one or more embodiments of the present disclosure.

FIG. 9 is a parity plot of training data comprising predicted versus measured tensile strength for training a cement performance property model using a plurality of cement barrier designs, in accordance with one or more embodiments of the present disclosure. In the illustrated example, a random forest cement performance property model was built to relate tensile strength to composition, curing, and testing conditions. FIG. 10 is a parity plot of testing data to show the cement performance property model predictions of the cement performance property model trained in FIG. 9, and which also comprises predicted versus measured tensile strength for a plurality of cement barrier designs, in accordance with one or more embodiments of the present disclosure. Each datapoint in FIG. 10 represents a prediction by the trained cement performance property model of FIG. 9 for a unique cement barrier design.

Figure 11:
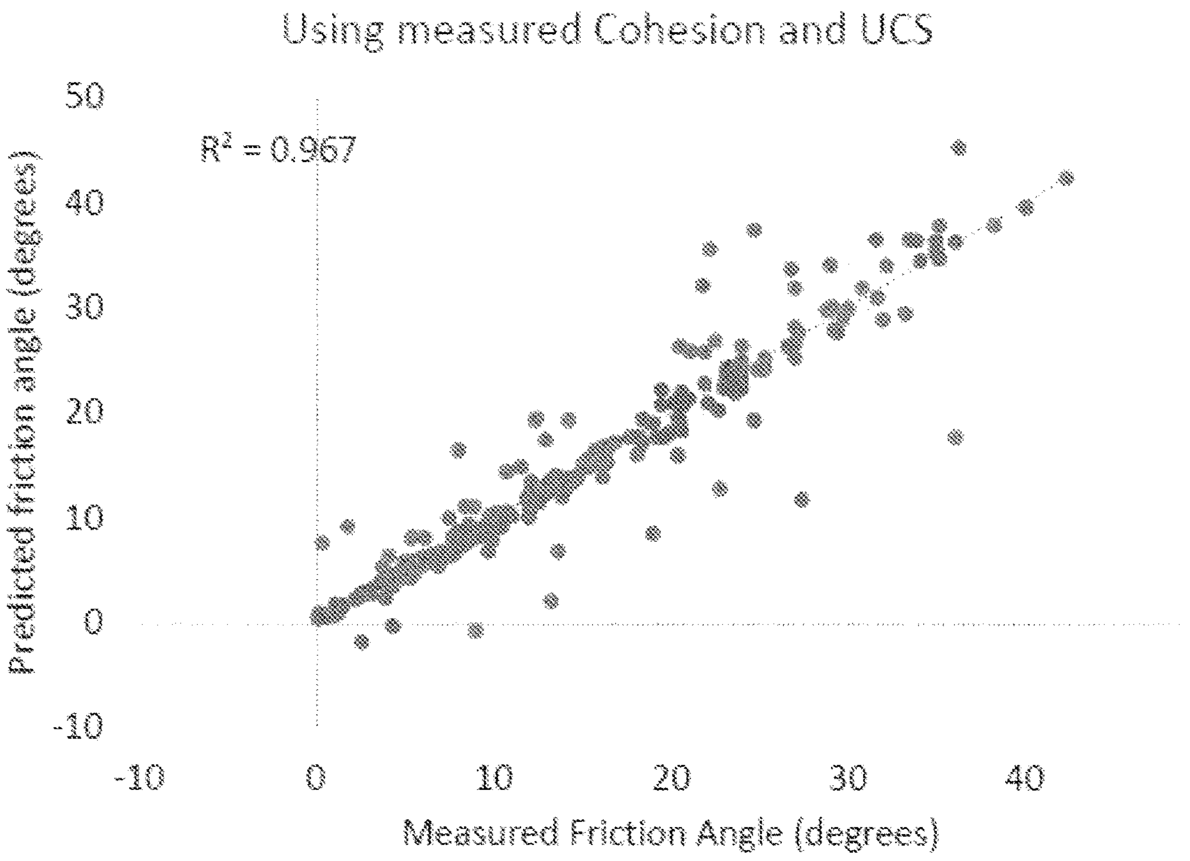
FIG. 11 is a plot showing predicted friction angle and measured friction angle using measured cohesion and ultimate compressive strength, in accordance with one or more embodiments of the present disclosure.

FIG. 11 is a plot showing predicted friction angle and measured friction angle using measured cohesion and ultimate compressive strength, in accordance with one or more embodiments of the present disclosure. In the illustrated example, friction angle (φ) was calculated using Equation 2. Either or both the ultimate compressive strength and the cohesion used in the friction angle calculation may be measured or predicted, e.g., using the trained cement performance property model(s) of FIGS. 5 and 7, in some examples. In the plot shown in FIG. 11, cohesion is calculated and compared with its measured values for a plurality of cement barrier designs. As illustrated, except for a few data points, the calculated cohesion compares well with its measured value, showing good fidelity of the trained cement performance property models of FIGS. 5 and 7 to use in the methods and systems of the present disclosure, e.g., workflow 400 of FIG. 4.

Figure 12:
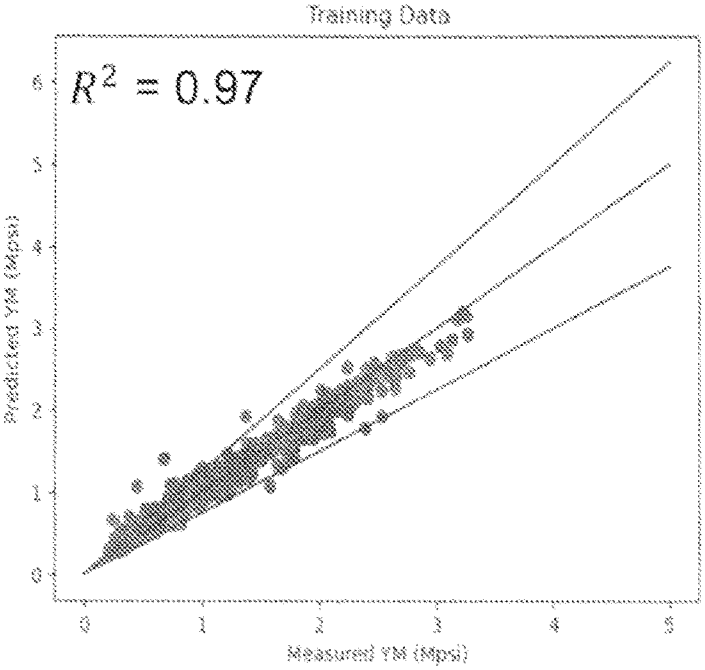
FIG. 12 is a parity plot of training data comprising predicted versus measured Young's modulus for training a cement performance property model using a plurality of cement barrier designs, in accordance with one or more embodiments of the present disclosure.
Figure 13:
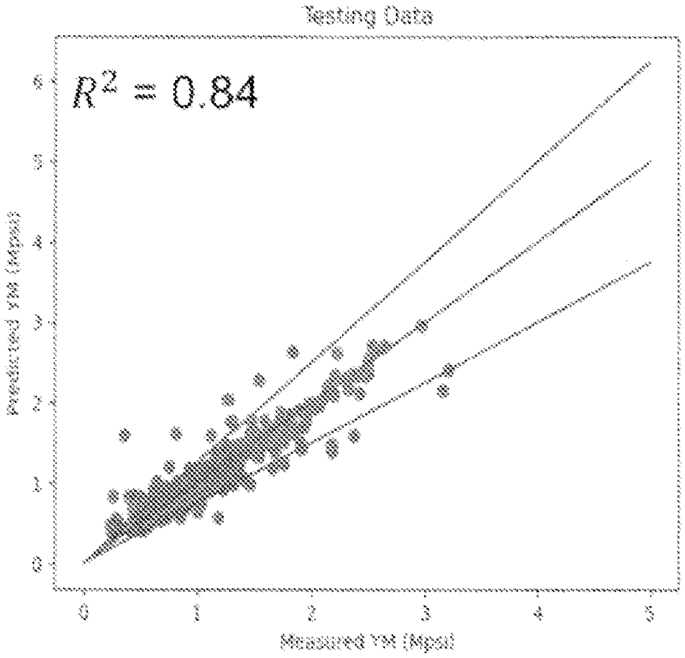
FIG. 13 is a parity plot of testing data to show the predictions of the cement performance property model trained in FIG. 5, and which also comprises predicted versus measured Young's modulus for a plurality of cement barrier designs, in accordance with one or more embodiments of the present disclosure.

FIG. 12 is a parity plot of training data comprising predicted versus measured Young's modulus for training a cement performance property model using a plurality of cement barrier designs, in accordance with one or more embodiments of the present disclosure. FIG. 13 is a parity plot of testing data to test the cement performance property model predictions of the cement performance property model trained in FIG. 12, and which also comprises predicted versus measured Young's modulus for a plurality of cement barrier designs, in accordance with one or more embodiments of the present disclosure. As illustrated, the parity plot and $R^2$ values show excellent fit. Without being limited by theory, it is believed that the measurement variations shown by FIGS. 12 and 13 and other figures are attributed to gauge repeatability and reproducibility and other factors.

Figure 14:
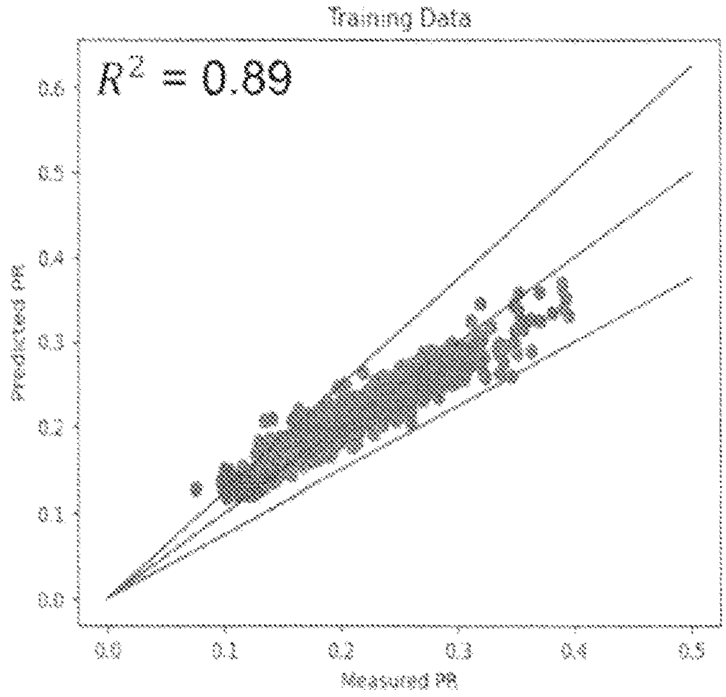
FIG. 14 is a parity plot of training data comprising predicted versus measured Poisson's ratio for training a cement performance property model using a plurality of cement barrier designs, in accordance with one or more embodiments of the present disclosure.
Figure 15:
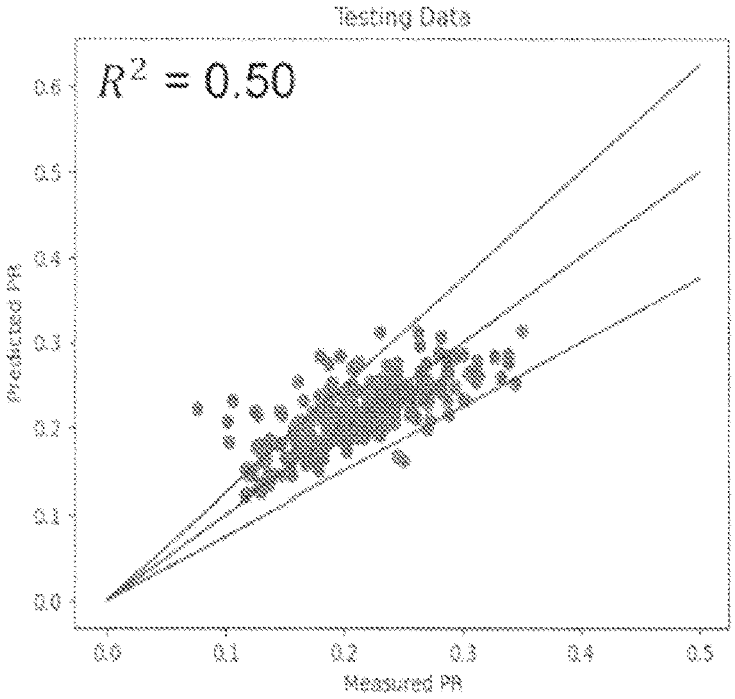
FIG. 15 is a parity plot of testing data to show the predictions of the cement performance property model trained in FIG. 7, and which also comprises predicted versus measured Poisson's ratio for a plurality of cement barrier designs, in accordance with one or more embodiments of the present disclosure.

FIG. 14 is a parity plot of training data comprising predicted versus measured Poisson's ratio for training a cement performance property model using a plurality of cement barrier designs, in accordance with one or more embodiments of the present disclosure. In the illustrated example, a random forest cement performance property model was built to relate Poisson's ratio to composition, curing, and testing conditions. FIG. 15 is a parity plot of testing data to assess accuracy the cement performance property model predictions of the cement performance property model trained in FIG. 14, and which also comprises predicted versus measured Poisson's ratio for a plurality of cement barrier designs, in accordance with one or more embodiments of the present disclosure. Each datapoint in FIG. 15 represents a prediction by the trained cement performance property model of FIG. 14 for a unique cement barrier design. It is possible to improve the $R^2$ of the Poisson ratio cement performance property model of FIG. 14 with further data cleaning and fine tuning. As with the other trained cement performance property models shown by the present figures, the trained Young's modulus and Poisson ratio cement performance property models of FIGS. 12-15 show good fidelity and are viable to be used with the methods and systems of the present disclosure, e.g., workflow 400 of FIG. 4.

The methods and systems described above are an improvement over current technology in that they provide techniques for predicting cement failure properties which are both fast and reliable. Predictions of these and other performance properties of cement may assist engineers to make more informed decisions about cement designs. These predictions may be readily available in some examples, such as when digital technology (e.g., information handling system 114 of FIG. 4) is used to render the predictions in real-time, and thus may be displayed to an engineer or other personnel in real-time, such as during a cementing operation (e.g., while cement is being actively pumped into a wellbore), in some examples. Other specific improvements associated with one or more embodiments of the present disclosure may include a generally improved ability to design a cement for use in a cementing operation, a reduction in the need for time and expertise for designing the cement, an improved ability to quickly determine in advance how a cement will behave in the long-term, as well as an improved ability to render decisions on-the-fly, and other advantages. In addition, some embodiments may provide a digital system which recommends low-cost cement designs which are guaranteed to not only satisfy ultrasonic compressive strength analyzer, thickening, and fluid loss requirements, but also satisfy long-term mechanical property requirements.

The disclosed cement may also directly or indirectly affect the various downhole equipment and tools that can come into contact with wellbore treatment fluids during operations. Such equipment and tools may include, without limitation, wellbore casing, wellbore liner, completion string, insert strings, drill string, coiled tubing, slickline, wireline, drill pipe, drill collars, mud motors, downhole motors and/or pumps, surface-mounted motors and/or pumps, centralizers, turbolizers, scratchers, floats (e.g., shoes, collars, valves, and the like), logging tools and related telemetry equipment, actuators (e.g., electromechanical devices, hydromechanical devices, and the like), sliding sleeves, production sleeves, plugs, screens, filters, flow control devices (e.g., inflow control devices, autonomous inflow control devices, outflow control devices, and the like), coupling (e.g., electro-hydraulic wet connect, dry connect, inductive coupler, and the like), control lines (e.g., electrical, fiber optic, hydraulic, and the like), surveillance lines, drill bits and reamers, sensors or distributed sensors, downhole heat exchangers, valves and corresponding actuation devices, tool seals, packers, cement plugs, bridge plugs, and other wellbore isolation devices or components, and the like. Any of these components can be included in the systems and apparatuses generally described in the foregoing.

It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the elements that it introduces.

For the sake of brevity, only certain ranges are explicitly disclosed herein. However, ranges from any lower limit may be combined with any upper limit to recite a range not explicitly recited, as well as ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present disclosure is well adapted to attain the ends and advantages mentioned as well as those that are inherent therein. The particular examples disclosed above are illustrative only, as the present disclosure may be modified and practiced in different but equivalent manners apparent to those skilled in the art having the benefit of the teachings herein. Although individual examples are discussed, the disclosure covers all combinations of all those examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of the present disclosure. If there is any conflict in the usages of a word or term in this specification and one or more patent(s) or other documents that may be incorporated herein by reference, the definitions that are consistent with this specification should be adopted.

What is claimed is:

1. A method of designing a cement slurry comprising:

(a) providing cement design requirements for the cement slurry wherein the cement design requirements comprise at least one cement performance property selected from the group consisting of compressive strength, tensile strength, cohesion, friction angle, Young's modulus, Poisson's ratio, and any combination thereof;

(b) providing a virtual cement slurry recipe representing at least water and a concentration thereof and one or more cementitious materials and a concentration thereof;

(c) inputting at least a well condition and the virtual cement slurry into a cement performance property model;

(d) predicting performance properties for the virtual cement slurry recipe using at least the cement performance property model, wherein the performance properties comprise at least one of compressive strength, tensile strength, cohesion, friction angle, Young's modulus, and Poisson's ratio;

(e) comparing the predicted performance properties to the cement design requirements; and (f) preparing a cement slurry according to the virtual cement slurry recipe if the predicted performance properties for the virtual cement slurry recipe satisfy the cement design requirements or repeating (b)-(f) if the virtual cement slurry recipe does not satisfy the cement design requirements, where the step of providing the virtual cement slurry recipe comprises providing a virtual cement slurry recipe with a disparate concentration of water, a disparate concentration of one or more of the cementitious materials, and/or a disparate chemical identity of the one or more cementitious materials.

2. The method of claim 1, wherein the performance properties further comprise fluid loss and thickening time.

3. The method of claim 1, wherein the virtual cement slurry recipe further represents at least one cement additive selected from the group consisting of an accelerator, a retarder, latex, polyvinyl alcohol, crystalline silica, and any combination thereof.

4. The method of claim 1, wherein the cement performance property model comprises a neural network, a decision tree, or a random forest model.

5. The method of claim 1, wherein the method further comprises training one or more machine learning algorithms using training data to form the cement performance property model, wherein the training data comprises a plurality of cement composition data and cement property comprising ultimate compressive strength, tensile strength, friction angle, cohesion, Young's modulus, and Poisson's ratio for each of the plurality of cement composition data.

6. The method of claim 1, wherein the one or more cementitious materials comprise at least one pozzolanic material selected from the group consisting of fly ash, pumice, silicalite, cement kiln dust, and any combination thereof.

7. The method of claim 1, wherein the cement slurry comprises at least one density modifier selected from the group consisting of a light weight bead, a heavy weight metal oxide, an elastomer, a fiber, and any combination thereof.

8. The method of claim 1, wherein the well condition comprises curing temperature, a curing pressure, a curing time, and a confining pressure.

9. The method of claim 1, wherein the predicted performance properties comprise friction angle, and wherein the friction angle is predicted using measurements of ultimate compressive strength and cohesion.

10. The method of claim 1, wherein the predicted performance properties comprise ultimate compressive strength and cohesion, wherein the method further comprises determining friction angle from the predictions of ultimate compressive strength and cohesion.

11. The method of claim 10, wherein determining the friction angle comprises using an equation having the form $$\text{Cohesion} = \frac{UCS}{2}\left(\frac{1-\sin\varphi}{\cos\varphi}\right)$$

where UCS is the predicted ultimate compression strength, Cohesion is predicted cohesion, and q is the friction angle.

12. The method of claim 10, wherein the cement slurry is prepared according to the new cement slurry recipe if the predicted friction angle is greater than or equal to a friction angle requirement.

13. The method of claim 1, wherein the cement performance property model comprises a linear model having the form:

$$C_l = a_0\left(\frac{w}{\text{Mass } Poz}\right) + \sum_i\left(\frac{Vol_i}{Vol\,Poz}\right)a_i + \sum_j\left(\frac{\text{Mass Add}_j}{\text{Mass } Poz}\right)a_j + \sum_k\left(\frac{\text{Mass blend}_k}{\text{Mass } Poz}\right)a_k + \sum_l(\text{Well } Cond_l)a_l$$

where $C_l$ is a performance property of a cement, w is mass of water, Mass Poz is mass of pozzolans, Vol Poz is a volume of pozzolans, $Vol_i$ is volume of pozzolanic species i, $Mass\ Add_j$ is the mass of an additive j, mass blend is the mass of a blend species k, $Well\ Cond_l$ is a well condition l, and $a_0$, $a_i$, $a_j$, $a_k$, and $a_l$ are constants.

14. The method of claim 1, wherein the cement performance property model comprises a non-linear model having the form:

$$C_l = a_0\left(\frac{w}{\text{Mass } Poz}\right)^a + e^{\sum_i\left(\frac{Vol_i}{Vol\,Poz}\right)a_i} + e^{\sum_j\left(\frac{Mass\,Add_j}{Mass\,Poz}\right)a_j} + e^{\sum_k\left(\frac{Mass\,blend_k}{Mass\,Poz}\right)a_k} + e^{\sum_l(Well\,Cond_l)a_l}$$

where $C_l$ is a performance property of a cement, w is mass of water, Mass Poz is mass of pozzolans, Vol Poz is a volume of pozzolans, $Vol_i$ is volume of pozzolanic species i, $Mass\ Add_j$ is the mass of an additive j, mass $blend_k$ is the mass of a blend species k, Well Cond is a well condition l, and $a_0$, $a_i$, $a_j$, $a_k$, and $a_l$ are constants.

15. The method of claim 1, further comprising introducing the cement slurry in a subterranean formation.

16. A method of designing a cement slurry comprising:

providing cement design requirements for the cement slurry wherein the cement design requirements comprise at least one cement performance property selected from the group consisting of compressive strength, tensile strength, cohesion, friction angle, Young's modulus, Poisson's ratio, and any combination thereof;

providing a virtual cement slurry recipe representing at least water and a concentration thereof and one or more cementitious materials and a concentration thereof;

inputting at least a curing temperature, a curing pressure, a curing time, a confining pressure into a cement performance property model, and the virtual cement slurry into a cement performance property model;

predicting performance properties for the virtual cement slurry using the cement performance property model, wherein the performance properties comprise at least one of compressive strength, tensile strength, cohesion, friction angle, Young's modulus, and Poisson's ratio;

comparing the predicted performance properties to the cement design requirements; and modifying the virtual cement slurry recipe if the predicted performance properties to the cement design requirements, wherein the modifying comprises forming a new virtual cement slurry with a different concentration for at least one of the one or more cementitious materials or preparing a cement slurry according to the virtual cement slurry recipe if the predicted performance properties meet or exceed the cement design requirements.

17. The method of claim 16, wherein the cement performance property model comprises a neural network, a tree-based model, or a random forest model.

18. The method of claim 16, wherein the cement performance property model comprises a linear model having the form:

$$C_l = a_0\left(\frac{w}{\text{Mass } Poz}\right) + \sum_i \left(\frac{Vol_i}{Vol\ Poz}\right) a_i + \sum_j \left(\frac{\text{Mass Add}_j}{\text{Mass } Poz}\right) a_j + \sum_k \left(\frac{\text{Mass blend}_k}{\text{Mass } Poz}\right) a_k + \sum_l (\text{Well } Cond_l) a_l$$

where $C_l$ is a performance property of a cement, w is mass of water, Mass Poz is mass of pozzolans, Vol Poz is a volume of pozzolans, $Vol_i$ is volume of pozzolanic species i, Mass $Add_j$ is the mass of an additive j, mass $blend_k$ is the mass of a blend species k, Well $Cond_l$ is a well condition l, and $a_0$, $a_i$, $a_j$, $a_k$, and $a_l$ are constants.

19. The method of claim 16, wherein the cement performance property model comprises a non-linear model having the form:

$$C_l = a_0\left(\frac{w}{\text{Mass } Poz}\right)^a + e^{\sum_i \left(\frac{Vol_i}{Vol\ Poz}\right) a_i} + e^{\sum_j \left(\frac{Mass\ Add_j}{Mass\ Poz}\right) a_j} + e^{\sum_k \left(\frac{Mass\ blend_k}{Mass\ Poz}\right) a_k} + e^{\sum_l (Well\ Cond_l) a_l}$$

where $C_l$ is a performance property of a cement, w is mass of water, Mass Poz is mass of pozzolans, Vol Poz is a volume of pozzolans, $Vol_i$ is volume of pozzolanic species i, Mass $Add_j$ is the mass of an additive j, mass $blend_k$ is the mass of a blend species k, Well $Cond_l$ is a well condition l, and $a_0$, $a_i$, $a_j$, $a_k$, and $a_l$ are constants.

20. The method of claim 13 further comprising introducing the cement slurry in a subterranean formation.

* * * * *